(12) United States Patent
Lai et al.

(10) Patent No.: US 12,279,459 B2
(45) Date of Patent: *Apr. 15, 2025

(54) DISPLAY PANEL AND DISPLAY DEVICE

(71) Applicant: Xiamen Tianma Micro-Electronics Co., Ltd., Xiamen (CN)

(72) Inventors: Qingjun Lai, Xiamen (CN); Yihua Zhu, Xiamen (CN); Yong Yuan, Xiamen (CN); Ping An, Xiamen (CN); Zhaokeng Cao, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/384,578

(22) Filed: Oct. 27, 2023

(65) Prior Publication Data

US 2024/0063227 A1 Feb. 22, 2024

Related U.S. Application Data

(63) Continuation of application No. 17/452,969, filed on Oct. 29, 2021, now Pat. No. 11,830,882.

(30) Foreign Application Priority Data

Dec. 30, 2020 (CN) .......................... 202011612371.7

(51) Int. Cl.
G09G 3/3225 (2016.01)
H10D 86/40 (2025.01)
(Continued)

(52) U.S. Cl.
CPC ........... H10D 86/60 (2025.01); G09G 3/3225 (2013.01); H10D 86/431 (2025.01);
(Continued)

(58) Field of Classification Search
CPC ............. H01L 27/1237; H01L 27/1251; H01L 27/1225; G09G 3/3225; G09G 2300/0426;
(Continued)

(56) References Cited

U.S. PATENT DOCUMENTS 10,622,430 B2 4/2020 Jeong et al.
2008/0111195 A1* 5/2008 Atanackovic ....... H01L 29/4908
257/E29.151
(Continued)

Primary Examiner — Benjamin C Lee
Assistant Examiner — Nathan P Brittingham
(74) Attorney, Agent, or Firm — Anova Law Group, PLLC

(57) ABSTRACT

A display panel includes a base substrate, a third transistor and a fourth transistor. The third transistor and the fourth transistor are formed on the base substrate. The third transistor includes a sixth gate electrode, a third active layer, a third source electrode, and a third drain electrode. The third active layer includes an oxide semiconductor. The fourth transistor includes an eighth gate electrode, a fourth active layer, a fourth source electrode, and a fourth drain electrode. The fourth active layer includes another oxide semiconductor. Along a direction perpendicular to the base substrate, a distance between the sixth gate electrode and the third active layer is D6. A channel region of the third transistor defined by the sixth gate electrode is a sixth channel region. A length of the sixth channel region is L6. A sixth area $S6 = L6 \times D6$.

18 Claims, 18 Drawing Sheets

(51) Int. Cl.
*H10D 86/60* (2025.01)
*H10K 59/121* (2023.01)

(52) U.S. Cl.
CPC ... *H10D 86/471* (2025.01); *G09G 2300/0426* (2013.01); *G09G 2300/0465* (2013.01); *G09G 2300/0814* (2013.01); *G09G 2300/0842* (2013.01); *H10D 86/423* (2025.01); *H10K 59/1213* (2023.02)

(58) Field of Classification Search
CPC ... G09G 2300/0465; G09G 2300/0814; G09G 2300/0842; H10K 59/1213
See application file for complete search history.

(56) References Cited

U.S. PATENT DOCUMENTS

| | | | |
|---|---|---|---|
| 2016/0248426 A1* | 8/2016 | Pi | H03K 19/018507 |
| 2018/0006102 A1 | 1/2018 | Oh et al. | |
| 2019/0378886 A1* | 12/2019 | Jeong | H01L 27/1248 |

* cited by examiner

DISPLAY PANEL AND DISPLAY DEVICE

CROSS-REFERENCE TO RELATED APPLICATION

This application is a continuation of U.S. patent application Ser. No. 17/452,969, filed on Oct. 29, 2021, which claims the priority of Chinese Patent Application No. 202011612371.7, filed on Dec. 30, 2020, the entire contents of both of which are incorporated herein by reference.

TECHNICAL FIELD

The present disclosure generally relates to the field of display technology and, more particularly, relates to a display panel and a display device.

BACKGROUND

Currently, display panels are widely used in mobile phones, handheld computers, and other portable electronic products, including thin-film transistor liquid crystal displays (TFT-LCD), organic light-emitting diode displays (OLED), low temperature poly silicon (LTPS) displays, plasma display panels (PDP), and the like.

The organic light-emitting diode display may have a display pixel array based on light-emitting diodes. In such type display, each display pixel may include a light-emitting diode and a thin-film transistor configured for controlling an applied signal to the light-emitting diode. A thin-film display driver circuit may be included in the display. For example, the thin-film transistors may be used to form a gate electrode driver circuit and a demultiplexer circuit on the display.

Currently, with the display technology development and driven by market competition, the display devices with desirable display effect are gaining more popularity. The display pixel density (pixels per inch (PPI) which indicates the number of pixels per inch) has become an important indicator to measure the display effect of the displays. The higher the PPI value is, the higher the density, which the display screen can display pictures, is, and the higher the fidelity is.

Therefore, there is a need to develop a display panel with improved PPI and desirable display effect.

SUMMARY

One aspect of the present disclosure provides a display panel. The display panel includes a base substrate, a third transistor and a fourth transistor. The third transistor and the fourth transistor are formed on the base substrate. The third transistor includes a sixth gate electrode, a third active layer, a third source electrode, and a third drain electrode. The third active layer includes an oxide semiconductor. The fourth transistor includes an eighth gate electrode, a fourth active layer, a fourth source electrode, and a fourth drain electrode. The fourth active layer includes another oxide semiconductor. Along a direction perpendicular to the base substrate, a distance between the sixth gate electrode and the third active layer is $D6$. A channel region of the third transistor defined by the sixth gate electrode is a sixth channel region. A length of the sixth channel region is $L6$, and a sixth area $S6=L6 \times D6$. Along the direction perpendicular to the base substrate, a distance between the eighth gate electrode and the fourth active layer is $D8$. A channel region of the fourth transistor defined by the eighth gate electrode is an eighth channel region. A length of the eighth channel region is $L8$, and an eighth area $S8=L8 \times D8$. The display panel further includes a pixel circuit and a drive circuit providing a drive signal for the pixel circuit, wherein the third transistor is a drive transistor of the pixel circuit, the fourth transistor is a switch transistor of the pixel circuit, and $S6>S8$.

Another aspect of the present disclosure provides a display panel. The display panel includes a base substrate, a third transistor and a fourth transistor. The third transistor and the fourth transistor are formed on the base substrate. The third transistor includes a sixth gate electrode, a third active layer, a third source electrode, and a third drain electrode. The third active layer includes an oxide semiconductor. The fourth transistor includes an eighth gate electrode, a fourth active layer, a fourth source electrode, and a fourth drain electrode. The fourth active layer includes another oxide semiconductor. Along a direction perpendicular to the base substrate, a distance between the sixth gate electrode and the third active layer is $D6$. A channel region of the third transistor defined by the sixth gate electrode is a sixth channel region. A length of the sixth channel region is $L6$, and a sixth area $S6=L6 \times D6$. Along the direction perpendicular to the base substrate, a distance between the eighth gate electrode and the fourth active layer is $D8$. A channel region of the fourth transistor defined by the eighth gate electrode is an eighth channel region. A length of the eighth channel region is $L8$, an eighth area $S8=L8 \times D8$, and $S6>S8$.

Another aspect of the present disclosure provides a display device including a display panel. The display panel includes a base substrate, a third transistor and a fourth transistor. The third transistor and the fourth transistor are formed on the base substrate. The third transistor includes a sixth gate electrode, a third active layer, a third source electrode, and a third drain electrode. The third active layer includes an oxide semiconductor. The fourth transistor includes an eighth gate electrode, a fourth active layer, a fourth source electrode, and a fourth drain electrode. The fourth active layer includes another oxide semiconductor. Along a direction perpendicular to the base substrate, a distance between the sixth gate electrode and the third active layer is $D6$. A channel region of the third transistor defined by the sixth gate electrode is a sixth channel region. A length of the sixth channel region is $L6$, and a sixth area $S6=L6 \times D6$. Along the direction perpendicular to the base substrate, a distance between the eighth gate electrode and the fourth active layer is $D8$. A channel region of the fourth transistor defined by the eighth gate electrode is an eighth channel region. A length of the eighth channel region is $L8$, and an eighth area $S8=L8 \times D8$. The display panel further includes a pixel circuit and a drive circuit providing a drive signal for the pixel circuit, wherein the third transistor is a drive transistor of the pixel circuit, the fourth transistor is a switch transistor of the pixel circuit, and $S6>S8$.

Other aspects of the present disclosure can be understood by those skilled in the art in light of the description, the claims, and the drawings of the present disclosure.

BRIEF DESCRIPTION OF THE DRAWINGS

Drawings incorporated in the specification and forming a part of the specification demonstrate the embodiments of the present disclosure and, together with the specification, describe the principles of the present disclosure.

DETAILED DESCRIPTION

Figure 1:
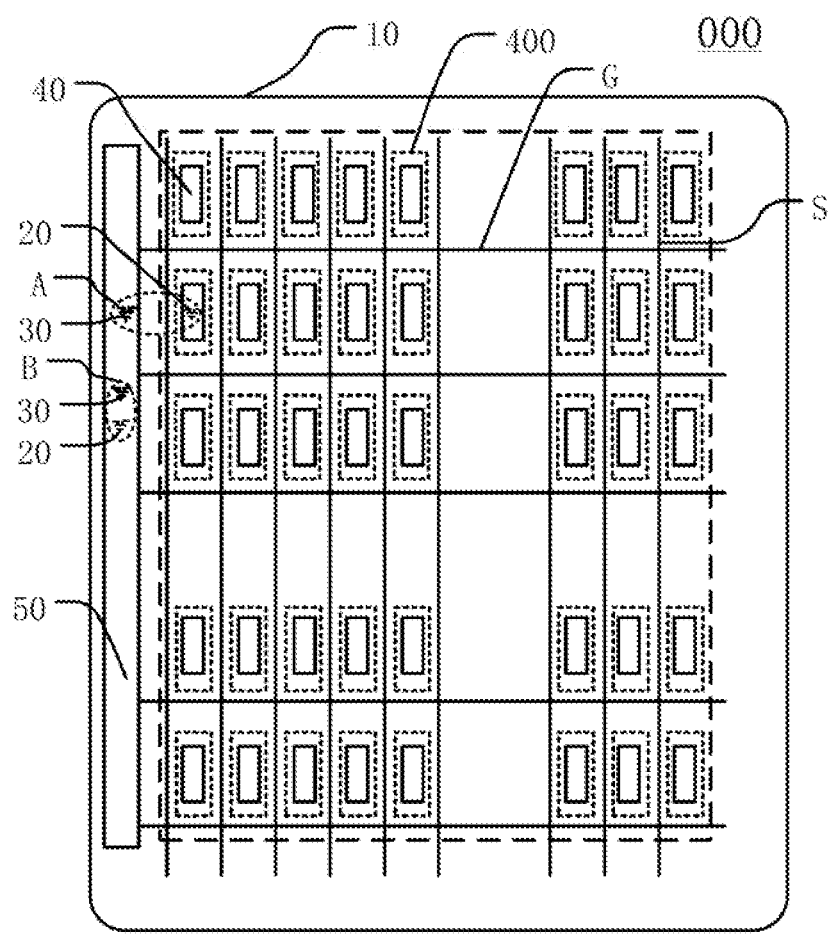
FIG. 1 illustrates a planar structural schematic of a display panel according to various embodiments of the present disclosure.

Various embodiments of the present disclosure are described in detail with reference to the drawings. It should be noted that the relative arrangement of components and steps, numerical expressions, and numerical values set forth in the embodiments may not limit the scope of the present disclosure unless specifically stated otherwise.

The following description of at least one exemplary embodiment is merely illustrative, which may not limit the present disclosure and its application or use.

Techniques, methods and equipment known to those skilled in the art may not be discussed in detail, but where appropriate, the techniques, methods and equipment should be considered as a part of the specification.

In all exemplary embodiments shown and discussed herein, any specific values should be interpreted as merely exemplary and not limiting. Therefore, other examples of the exemplary embodiments may have different values.

It should be noted that similar reference numerals and letters indicate similar items in the following drawings. Therefore, once an item is defined in one drawing, there is no need to discuss it further in subsequent drawings.

Figure 2:
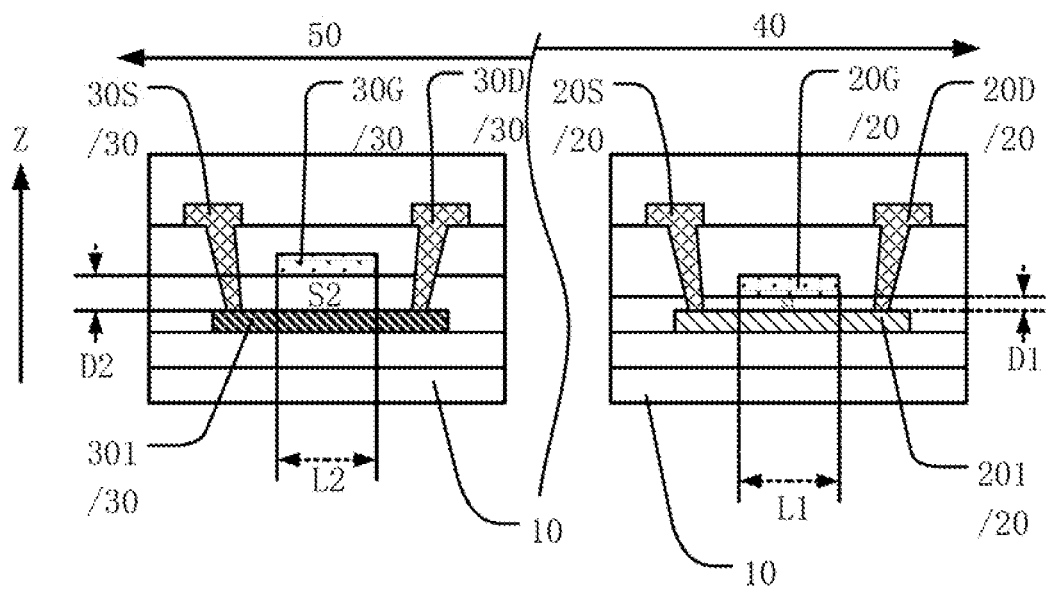
FIG. 2 illustrates a local film-layer cross-sectional structural schematic at a region A in FIG. 1.
Figure 3:
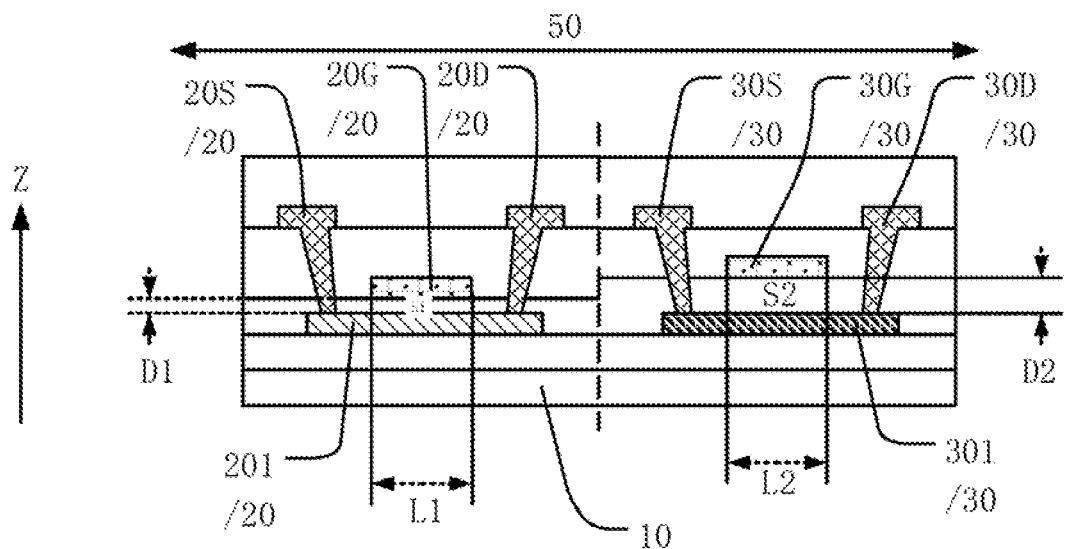
FIG. 3 illustrates a local film-layer cross-sectional structural schematic at a region B in FIG. 1.
Figure 4:
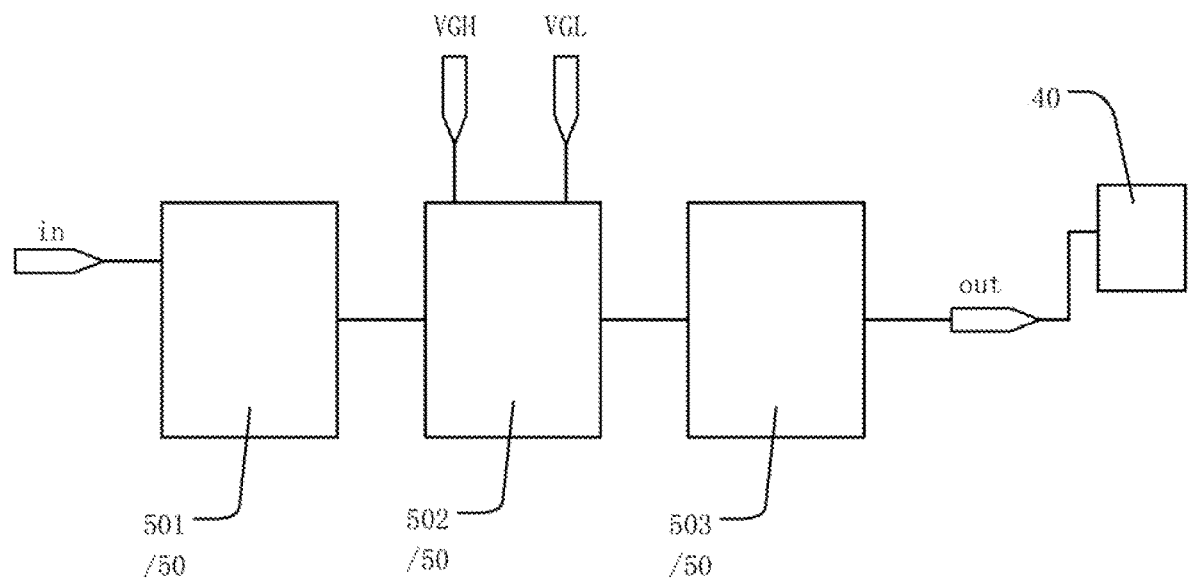
FIG. 4 illustrates a circuit connection block diagram of a drive circuit according to various embodiments of the present disclosure.
Figure 5:
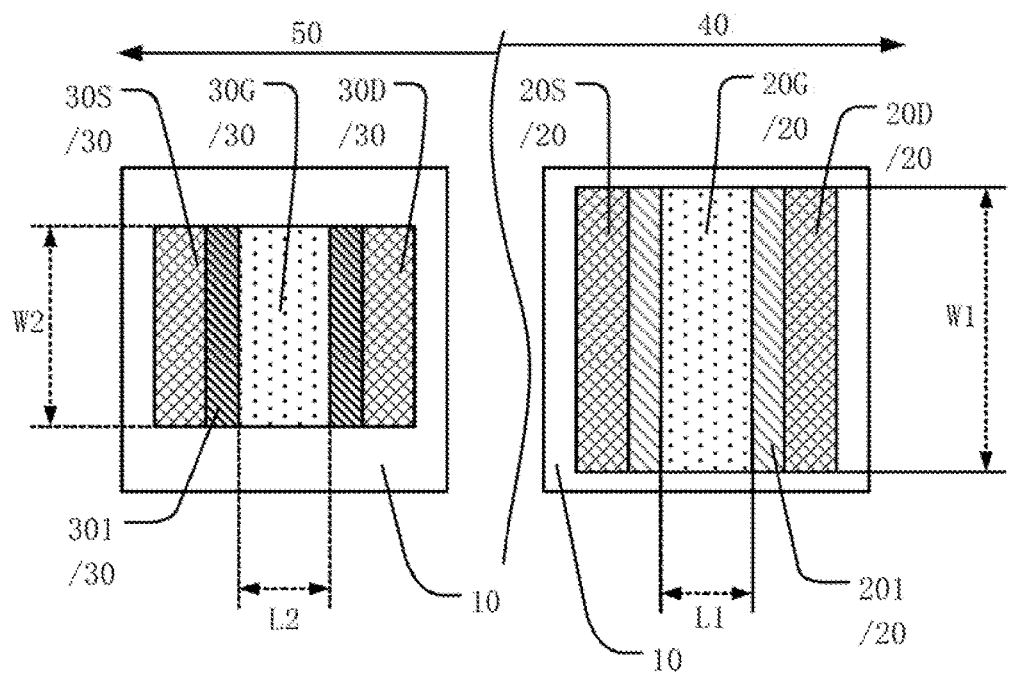
FIG. 5 illustrates a top structural view of a first transistor and a second transistor in FIG. 2.

Referring to FIGS. 1-3, FIG. 1 illustrates a planar structural schematic of a display panel according to various embodiments of the present disclosure; FIG. 2 illustrates a local film-layer cross-sectional structural schematic at a region A in FIG. 1; and FIG. 3 illustrates a local film-layer cross-sectional structural schematic at a region B in FIG. 1. It should be understood that FIGS. 2-3 may each exemplarily illustrate a local film-layer schematic of a first transistor and a second transistor. The first transistor and the second transistor may be illustrated together for description to clearly illustrate the technical features of the first transistor and the second transistor, which may not indicate the actual disposing positions of the first transistor and the second transistor in the display panel. During an implementation, the disposing positions and the connection relationship of the first transistor and the second transistor may be determined by the layout of the drive circuit and the pixel circuit. A display panel 000 provided in one embodiment may include a base substrate 10, first transistors 20, and second transistors 30. The first transistors 20 and the second transistors 30 may be formed on the base substrate 10. The first transistor 20 may include a first active layer 201, a first gate electrode 20G, and a first source electrode 20S, and a first drain electrode 20D, where the first active layer 201 may include silicon. The second transistor 30 may include a second active layer 301, a second gate electrode 30G, a second source electrode 30S, and a second drain electrode 30D, where the second active layer 301 may include an oxide semiconductor. Optionally, in one embodiment, the first transistor 20 and the second transistor 30 may both be top gate transistors as an example for description. In an implementation, the first transistor 20 and the second transistor 30 may also be other bottom gate transistors.

The length of the channel region of the first transistor 20 is L1. Along a direction Z perpendicular to the base substrate 10, the distance between the first gate electrode 20G and the first active layer 201 is D1, and the first area S1=L1×D1.

The length of the channel region of the second transistor 30 is L2. Along the direction Z perpendicular to the base substrate 10, the distance between the second gate electrode 30G and the second active layer 301 is D2, and the second area S2=L2×D2; where S1<S2.

The display panel 000 may include pixel circuits 40 and a drive circuit 50 which provides drive signals for the pixel circuits 40. The first transistor 20 and the second transistor 30 may be transistors in the drive circuit, that is, the drive circuit 50 may include the first transistor 20 or the second transistor 30. Furthermore, the first transistor 20 and the second transistor 30 may also be transistors in the pixel circuit, that is, the pixel circuit may include the first transistor 20 or the second transistor 30. If the second transistor 30 is in the pixel circuit, the second transistor may be a drive transistor or a switch transistor.

In some optional embodiments, the drive circuit 50 may include the second transistor 30, the pixel circuit 40 may include the first transistor 20, or the drive circuit 50 may include the first transistor 20.

For example, the display panel 000 of one embodiment may include the pixel circuits 40 and the drive circuit 50 which provides drive signals for the pixel circuits 40. Optionally, the drive circuit 50 may be a gate drive circuit for providing scan drive signals for the scan lines G of the display panel 000. The gate drive circuit may be formed on the base substrate 10, for example, disposed at the left edge of the display panel 100 (it should be understood that FIG. 1 of one embodiment only exemplarily illustrates a structure of the drive circuit 50 on the display panel as a block diagram which may not be limited according to various embodiments of the present disclosure, and the connection structure of the drive circuit 50 may not be limited in one embodiment), the right edge, only on a single edge of the display panel, or other position of the display panel. The drive circuit 50 may also be a demultiplexer circuit (not shown in FIGS. 1-3, the demultiplexer circuit may be located between a bonding region and the display region of the display panel 000), which is configured to demultiplex data signals from the drive chip at the bonding region or a flexible circuit board to a plurality of corresponding data lines S. The display panel 000 may include a plurality of display pixels 400, and each display pixel 400 may include a pixel circuit 40. The scan lines G and data lines S of the display panel 000 may be crossed and insulated to define the regions of the display pixels 400. It should be understood that FIG. 1 in one embodiment may not illustrate the connection structure of the pixel circuit 40, which is only represented by a block diagram. The pixel circuit 40 may be a circuit structure including a plurality of transistors and storage capacitors, which may not be limited according to various embodiments of the present disclosure, and the pixel circuit 40 may only need to provide the display drive signals for the display pixels 400. In one embodiment, FIG. 2 exemplarily illustrates that the drive circuit 50 includes the second transistor 30, and the pixel circuit 40 includes the first transistor 20; and FIG. 2 exemplarily illustrates that the drive circuit 50 includes the second transistor 30 and the first transistor 20, which may not limit the structures of the pixel circuit 40 and the drive circuit 50 during an implementation. In one embodiment, the circuit structures of the pixel circuit 40 and the drive circuit 50 which provides the drive signal for the pixel circuit 40 may not be limited according to various embodiments of the present disclosure, and it may only need to satisfy that the drive circuit 50 includes the second transistor 30, and the pixel circuit 40 includes the first transistor 20 or the drive circuit 50 includes the first transistor 20, such that at least two types of transistors are provided on the base substrate 10 of the display panel 000. In an implementation, the circuit structure may be understood according to the structures of the pixel circuit and the drive circuit designed for the display panel 000 to realize the display function in the existing technology.

In one embodiment, the first transistor 20 and the second transistor 30 may be formed on the base substrate 10. The first transistor 20 may include the first active layer 201, the first gate electrode 20G, the first source electrode 20S, and the first drain electrode 20D. The first active layer 201 may include silicon. That is, the first transistor 20 may be a silicon transistor. The silicon may be polysilicon, that is, LTPS (low temperature poly silicon) or low temperature polysilicon, deposited by a low-temperature method. The length of the channel region of the first transistor 20 is L1. The channel region of the first transistor 20 is the region where the first active layer 201 of the first transistor 20 overlaps the first gate electrode 20G. The length of the channel region of the first transistor 20 is the length of the channel region of the first transistor 20 along the current transmission direction between the first source electrode 20S and the first drain electrode 20D. The second transistor 30 may include the second active layer 301, the second gate electrode 30G, the second source electrode 30S, and the second drain electrode 30D. The second active layer 301 may include an oxide semiconductor, that is, the second transistor 30 is an oxide semiconductor transistor. The oxide semiconductor material may be an amorphous indium gallium zinc oxide (IGZO). The length of the channel region of the second transistor 30 is L2. The channel region of the second transistor 30 is the region where the second active layer 301 of the second transistor 30 overlaps the second gate electrode 30G. The length of the channel region of the second transistor 30 is the length of the channel region of the second transistor 30 along the current transmission direction between the second source electrode 30S and the second drain electrode 30D.

In the display panel 000 provided in one embodiment, along the direction Z perpendicular to the base substrate 10, the distance between the first gate electrode 20G and the first active layer 201 is D1, and the first area S1=L1×D1; and the distance between the second gate electrode 30G and the second active layer 301 is D2, the second area S2=L2×D2; where S1<S2. Optionally, the distance D1 between the first gate electrode 20G and the first active layer 201 may be configured to be less than the distance D2 between the second gate electrode 30G and the second active layer 301; or the length L1 of the channel region of the first transistor 20 may be also configured to be less than the length L2 of the channel region of the second transistor 30; or the distance D1 between the first gate electrode 20G and the first active layer 201 may be also configured to be less than the distance D2 between the second gate electrode 30G and the second active layer 301, and the length L1 of the channel region of the first transistor 20 may be also configured to be less than the length L2 of the channel region of the second transistor 30, thereby implementing that the first area S1 is less than the second area S2. In one embodiment, the first transistor 20 is a silicon transistor, the second transistor 30 is an oxide semiconductor transistor, and the first transistor 20 (e.g., a silicon transistor) has a faster carrier mobility compared with the second transistor 30 (e.g., an oxide semiconductor transistor); the first active layer 201 of the first transistor 20 includes silicon, the second active layer 301 of the second transistor 30 includes an oxide semiconductor, and the silicon transistor may not be sensitive to hydrogen, water and oxygen in the external environment than the oxide semiconductor transistor. Therefore, the distance D1 between the first gate electrode 20G of the first transistor 20 and the first active layer 201 may be configured to be less than the distance D2 between the second gate electrode 30G of the second transistor 30 and the second active layer 301 (as shown in FIGS. 2-3). The first transistor 20 (e.g., a silicon transistor) has desirable responsiveness. Therefore, in order to fully increase the PPI of the display panel 000, in one embodiment, the lengths (L1 and L2) of the channel regions of the two types of transistors may also be designed to be as small as possible by utilizing the advantages of silicon transistors and oxide semiconductor transistors, which is beneficial for saving circuit space and further increasing the PPI (pixels per inch) (pixel density, representing the number of pixels per inch) of the display panel 000. In one embodiment, along the direction Z perpendicular to the base substrate 10 of the display panel 000, the first area S1<the second area S2, where the first area S1=L1×D1, and the second area S2=L2×D2; and the distance between the first gate electrode 20G of the first transistor 20 (e.g., a silicon transistor) and the first active layer 201 is D1, and the distance between the second gate electrode 30G of the second transistor 30 (e.g., an oxide semiconductor transistor) and the second active layer 301 is D2. Therefore, the features and advantages of silicon transistors and oxide semiconductor transistors may be fully utilized, and while ensuring the stability and normal operation of the transistors, the space of the display panel may be saved and the PPI of the display panel may be improved, which is further beneficial for improving the display quality of the display panel 000 and improving the display effect and the product competitiveness.

It should be noted that for the width and length of the channel region described above and below, the length of the channel region refers to a dimension between the source and the drain along the migration direction of the carriers; if such direction is defined as the second direction, the width of the channel region refers to the dimension of the channel region along the third direction, where the second direction may be perpendicular to the third direction.

Furthermore, it should be noted that FIGS. 1-3 in one embodiment may only exemplarily illustrate the planar structure of the display panel 000 and the cross-sectional structure of the local film-layer, which may not limit the structures included in the display panel 000 according to various embodiments of the present disclosure. The structures included in the display panel 000 may further include other film-layer structures which may implement the related functions of the display panel, such as various insulation layers, light-emitting layers, electrode layers (organic light-emitting display panels), and the like, which may not be limited according to various embodiments of the present disclosure. During an implementation, the structures of the display panel may be understood by referring to the existing technology.

In some optional embodiments, referring to FIGS. 1-3 and 4, FIG. 4 illustrates a circuit connection block diagram of a drive circuit according to various embodiments of the present disclosure. In one embodiment, the drive circuit 50 may include an input module 501, a logic transmission module 502, and an output module 503. The input module 501 may be connected between an input terminal in and the logic transmission module 502, and the output module 503 may be connected between the logic transmission module 502 and an output terminal out. The logic transmission module 502 may be connected to a high-level signal terminal VGH or a low-level signal terminal VGL, and the output terminal may be connected to the pixel circuit 40.

The logic transmission module 502 may include the second transistor 30 or the input module 501 may include the second transistor 30 and the output module 503 may include the first transistor 20.

In one embodiment, it may describe that the drive circuit 50 may be a gate drive circuit, which is configured to connect with the pixel circuit 40 through the scan line G to provide a scan drive signal for the pixel circuit 40. The drive circuit 50 may include the input module 501, the logic transmission module 502, and the output module 503. One terminal of the input module 501 may be connected to the input terminal in of the drive circuit 50, and the other terminal may be connected to the logic transmission module 502. The input terminal in may provide an input signal for the input module 501 through a connected driver chip or flexible circuit board. The logic transmission module 502 may be connected to the high-level signal terminal VGH or the low-level signal terminal VGL, and may include a NAND gate, a NOR circuit, or the like which may be a switch circuit of the high-level signal terminal VGH and the low-level signal terminal VGL. The other terminal of the logic transmission module 502 may be connected to the output module 503, the output module 503 may be connected to the output terminal out of the drive circuit 50, and the output terminal out may be connected to the pixel circuit 40, such that it may implement that the scan drive signal is provided for the pixel circuit 40 through the drive circuit 50. In one embodiment, the logic transmission module 502 of the drive circuit 50 may include the second transistor 30, or the input module 501 of the drive circuit 50 may include the second transistor 30, and the output module 503 may include the first transistor 20. The first area S1 of the first transistor 20 is smaller than the second area S2 of the second transistor 30, such that the length L1 of the channel region of the first transistor 20 may be configured to be smaller, or along the direction Z perpendicular to the base substrate 10, the distance D1 between the first gate electrode 20G and the first active layer 201 may be smaller, which may both make the first area S1 of the first transistor 20 smaller, thereby making the response speed of the first transistor 20 faster. In the drive circuit 50 provided in one embodiment, the input module 501 and the logic transmission module 502, especially the NAND circuit and NOR circuit of the logic transmission module 502, may be switch circuits of the high-level signal terminal VGH and the low-level signal terminal VGL. The switch circuits of the high-level signal terminal VGH and the low-level signal terminal VGL may require the transistor to have a relatively low leakage current in the cutoff state, such that the leakage current of the transistor may be avoided to affect the high-level signal and low-level signal after the logic signal is transmitted, thereby affecting the normal signal transmission of a next node. Therefore, in one embodiment, the logic transmission module 502 may be configured to include the second transistor 30 (e.g., an oxide semiconductor transistor), and the input module 501 may be configured to include the second transistor 30 (e.g., an oxide semiconductor transistor); the oxide semiconductor transistor may have a lower leakage current in the cutoff state, such that the leakage currents of other disposed transistors may be avoided to affect the switch of the high-level signal and the low-level signa after the logic signal of the input module 501 and the logic transmission module 502 is transmitted, thereby affecting the normal signal transmission of a next node. The output module 503 of the drive circuit 50 may require a relatively fast response speed and drive capability. Therefore, in one embodiment, the output module 503 may be configured to include the first transistor 20 (e.g., a silicon transistor), the first area S1 of the first transistor 20 may be relatively small, and the response speed may be faster, thereby ensuring the response and drive capability of the drive circuit 50 and avoiding problems such as signal delay and the like caused by the drive circuit 50 of the display panel 000.

It should be noted that, in one embodiment, the block diagram illustrates the connection structures of each module in the drive circuit 50. During an implementation, the circuit connection structures inside each module of the drive circuit 50 may be designed according to actual requirements, which may not be limited according to various embodiments of the present disclosure.

Figure 6:
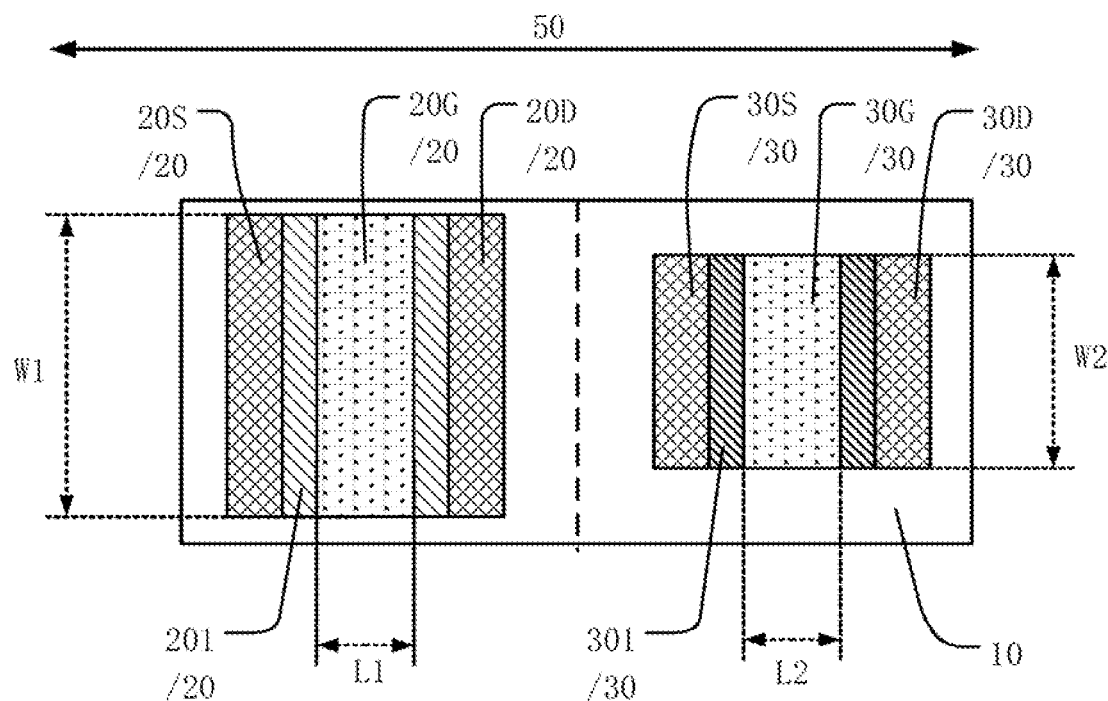
FIG. 6 illustrates a top structural view of a first transistor and a second transistor in FIG. 3.

In some optional embodiments, referring to FIGS. 1-4, 5, and 6, FIG. 5 illustrates a top structural view of the first transistor and the second transistor in FIG. 2; and FIG. 6 illustrates a top structural view of the first transistor and the second transistor in FIG. 3. In one embodiment, the width of the channel region of the first transistor 20 is W1, the width of the channel region of the second transistor 30 is W2, the first volume V1=S1×W1, and the second volume V2=S2×W2, where V1>V2. The channel region of the first transistor 20 may be the region where the first active layer 201 of the first transistor 20 overlaps the first gate electrode 20G. The length L1 of the channel region of the first transistor 20 may be the length of the channel region of the first transistor 20 along the current transmission direction between the first source electrode 20S and the first drain electrode 20D. The width W1 of the channel region of the first transistor 20 may be the length of the channel region of the first transistor 20 along a direction perpendicular to the length direction of the channel region of the first transistor 20. That is, the length direction of the channel region of the first transistor 20 may be perpendicular to the width direction of the channel region of the first transistor 20. The channel region of the second transistor 30 may be region where the second active layer 301 of the second transistor 30 overlaps the second gate electrode 30G. The length of the channel region of the second transistor 30 may be the length of the channel region of the second transistor 30 along the current transmission direction between the second source electrode 30S and the second drain electrode 30D. The width W2 of the channel region of the second transistor 30 may be the length of the channel region of the second transistor 30 along the direction perpendicular to the length direction of the channel region of the second transistor 30. That is, the length direction of the channel region of the second transistor 30 may be perpendicular to the width direction of the channel region of the second transistor 30.

In one embodiment, it may describe that the width of the channel region of the first transistor 20 (e.g., a silicon transistor) is W1, the first volume V1=S1×W1, the width of the channel region of the second transistor 30 (e.g., an oxide semiconductor transistor) is W2, and the second volume V2=S2×W2. Although the first area S1<the second area S2, the first volume V1 is configured to be greater than the second volume V2. Therefore, the first volume V1 is greater than the second volume V2 by sufficiently increasing the width W1 of the channel region of the first transistor 20 (e.g., a silicon transistor), that is, W1/W2>S2/S1, the ratio of the width W1 of the channel region of the first transistor 20 to the width W2 of the channel region of the second transistor 30 is greater than the ratio of the second area S2 to the first area S1. In such way, the transistor responsiveness of the output module 503 of the drive circuit 50 using the first transistor 20 may be further ensured, thereby further ensuring the output performance of the drive circuit 50, which is beneficial for improving the output effect.

Figure 7:
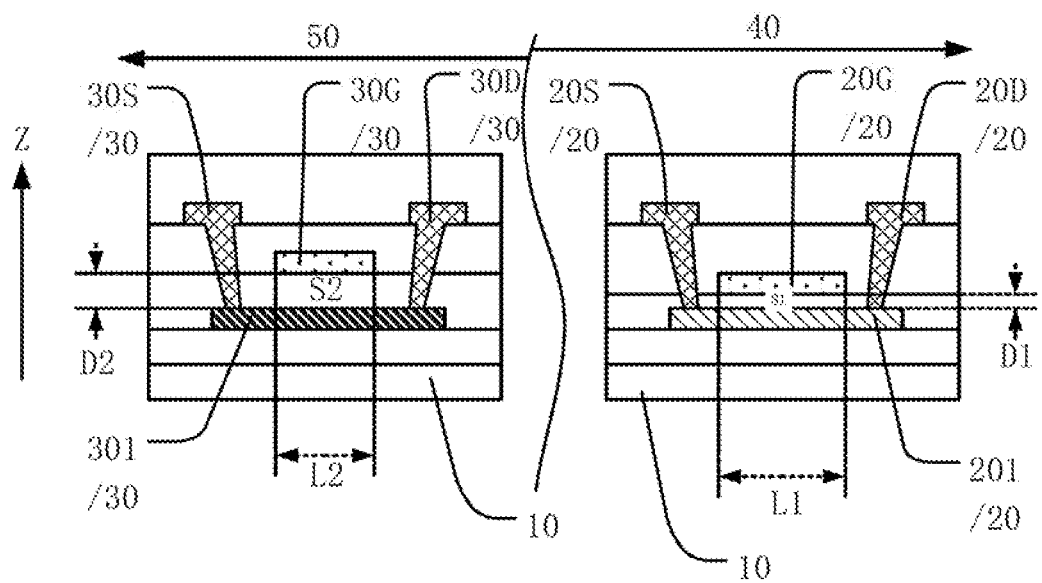
FIG. 7 illustrates another local film-layer cross-sectional structural schematic at a region A in FIG. 1.
Figure 8:
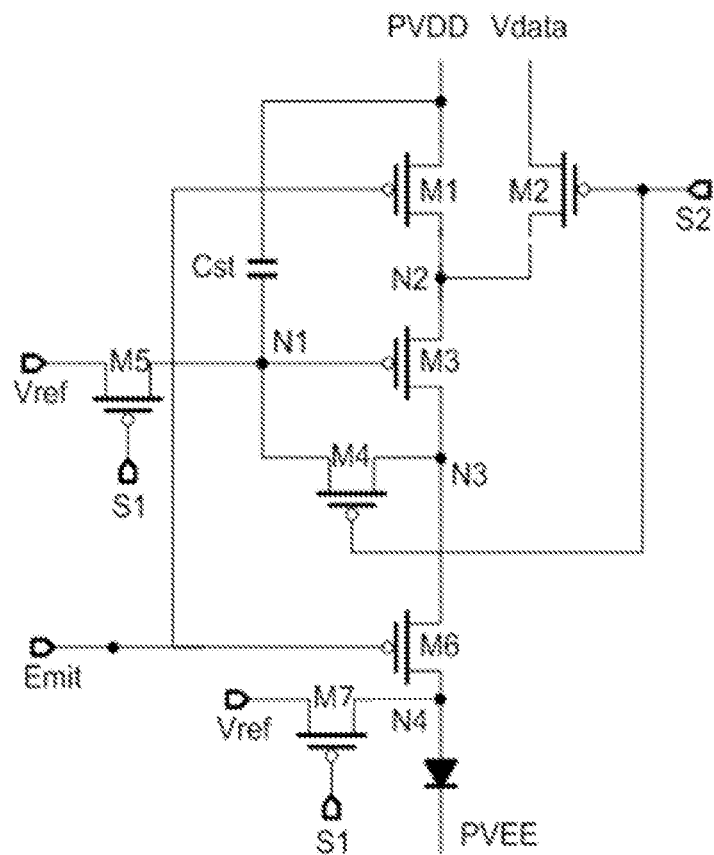
FIG. 8 illustrates a structural schematic of a pixel circuit according to various embodiments of the present disclosure.

In some optional embodiments, referring to FIGS. 1, 7 and 8, FIG. 7 illustrates another local film-layer cross-sectional structural schematic at the region A in FIG. 1; and FIG. 8 illustrates a structural schematic of the pixel circuit 40 according to various embodiments of the present disclosure. In one embodiment, the pixel circuit 40 may include the first transistor 20 which is the drive transistor of the pixel circuit 40, where D1/D2<L1/L2.

In one embodiment, it may describe that the pixel circuit 40 of the display pixel 400 may include the first transistor 20 (e.g., a silicon transistor), and the first transistor 20 may be the drive transistor of the pixel circuit 40. In the organic light-emitting display panel, the first transistor 20 used as the drive transistor may be electrically connected to a light-emitting unit to provide an anode voltage signal for the anode of each light-emitting unit. In such way, a certain drive electric field may be formed between the anode and the cathode of the light-emitting unit, thereby implementing the light emission of the light-emitting layer and further implementing the display function. Since the drive transistor of the pixel circuit 40 is used to perform the data write work of the pixel circuit 40, the accuracy of the threshold voltage of the drive transistor and the stability of the gate electrode potential may be extremely high. Therefore, there is a need to appropriately increase the distance between the gate electrode and the active layer of the transistor or the length of the channel region of the transistor, thereby obtaining a relatively accurate threshold voltage and ensuring the stability of the gate electrode potential of the drive transistor. Therefore, in one embodiment, the drive transistor of the pixel circuit 40 may be configured as the first transistor 20 (e.g., a silicon transistor), and the carrier mobility rate of the silicon transistor may be relatively high; when it is ensured that the first area S1 is smaller than the second area S2 and the increase of the length L1 of the channel region of the disposed first transistor 20 is relatively large, the response rate of the first transistor 20 may not be greatly affected. Therefore, in one embodiment, the drive transistor of the pixel circuit 40 may be configured as the first transistor 20 (e.g., a silicon transistor), and the ratio of the distance D1 between the first gate electrode 20G of the first transistor 20 and the first active layer 201 to the distance D2 between the second gate electrode 30G of the second transistor 30 and the second active layer 301 may be less than the ratio of the length L1 of the channel region of the first transistor 20 to the length L2 of the channel region of the second transistor 30. That is, the length L1 of the channel region of the first transistor 20 may be greater than or equal to the length L2 of the channel region of the second transistor 30. In such way, a relatively accurate threshold voltage of the drive transistor may be obtained, the stability of the gate electrode potential of the drive transistor may be ensured, and the significant influence on the response rate of the first transistor 20 may be avoided, which is beneficial for ensuring the response capability of the pixel circuit 40.

Figure 9:
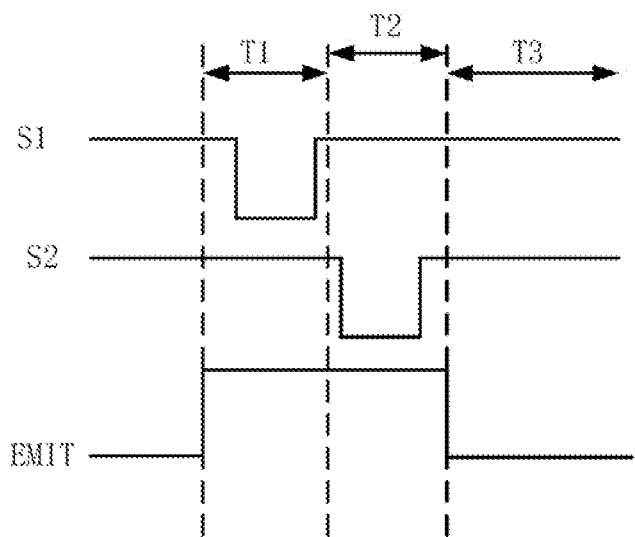
FIG. 9 illustrates a working sequence diagram of a pixel circuit in FIG. 8.

Optionally, as shown in FIGS. 8-9, FIG. 9 illustrates a working sequence diagram of the pixel circuit in FIG. 8. The pixel circuit 40 may include a plurality of switch transistors and drive transistors (M1-M7), a storage capacitor Cst, and a light-emitting diode OLED, where the transistor M3 is a drive transistor, and remaining transistors are switch transistors. Taking the structure of the pixel circuit 40 as an example, the working principle of the pixel circuit 40 may be described as follows. In an initial reset stage T1, the transistors M5 and M7 may be in conduction, the other transistors may be in cutoff, the potential of a node N1 may be a reference voltage Vref, the potential of a node N4 may be a reference voltage Vref, and the anode of the light-emitting diode OLED may be reset; in a data write and threshold fetch stage T2, the transistor M2, the transistor M3 and the transistor M4 may be in conduction, the other transistors may be in cutoff, the potential of a node N2 may be a data voltage Vdata, the potential of the node N1 and a node N3 may be Vdata−|Vth|, where Vth is the threshold voltage of the transistor M3; and in a light-emitting stage T3, the transistor M1, the transistor M3, and the transistor M6 may be conduction, the other transistors may be in cutoff, a signal of a positive power supply voltage PVDD may be transmitted to the transistor M3, the transistor M3 may generate a drive current to drive the light-emitting diode OLED to emit light, the potential of the node N2 may be the positive power supply voltage PVDD, the potential of the node N1 may be Vdata−|Vth|, the potential of the node N3 may be PVEE+Voled, PVEE may be a negative power supply voltage, Voled may be a corresponding voltage on the light-emitting diode OLED, and a light-emitting current may be Id=k(Vsg−|Vth|)2=k(PVDD−Vdata−|Vth|)2. Optionally, in one embodiment, the structure of the pixel circuit 40 may be taken as an example, and the first transistor 20 (e.g., a silicon transistor) may be the drive transistor M3 in the pixel circuit 40.

It should be noted that an implementable circuit structure of the pixel circuit 40 may be exemplarily described in one embodiment, which may not be limited according to various embodiments of the present disclosure. The structure of the pixel circuit 40 may be other structure, which may not be limited according to various embodiments of the present disclosure.

Figure 10:
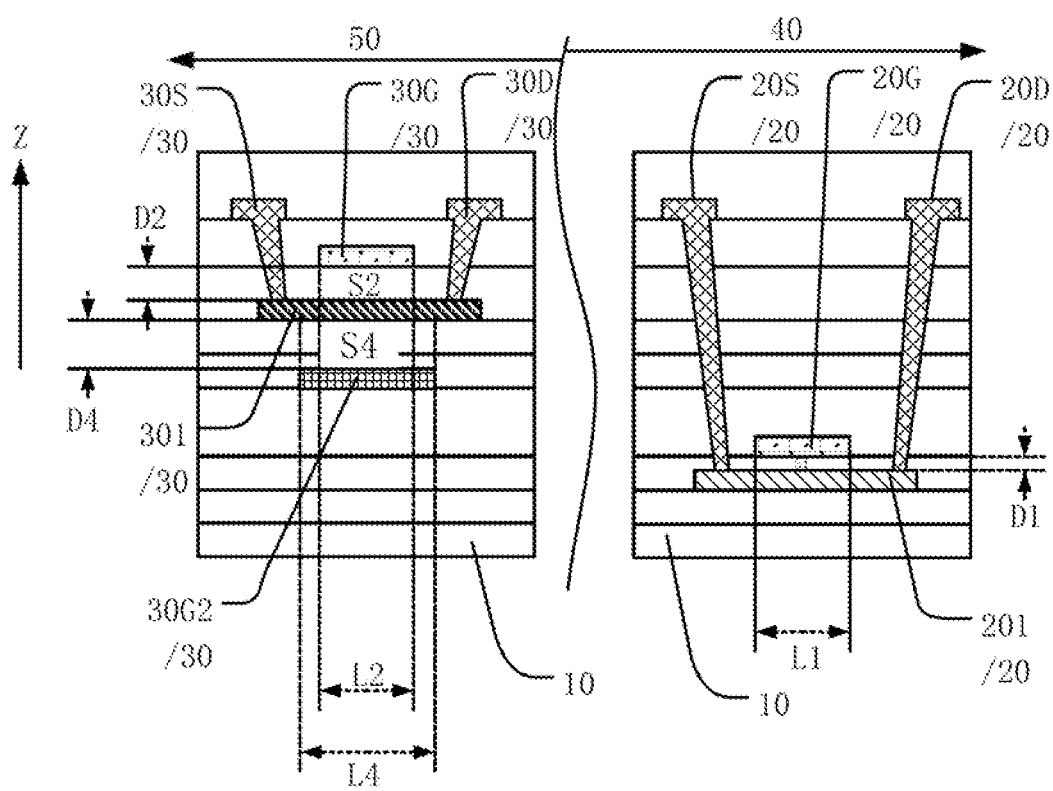
FIG. 10 illustrates another local film-layer cross-sectional structural schematic at a region A in FIG. 1.
Figure 11:
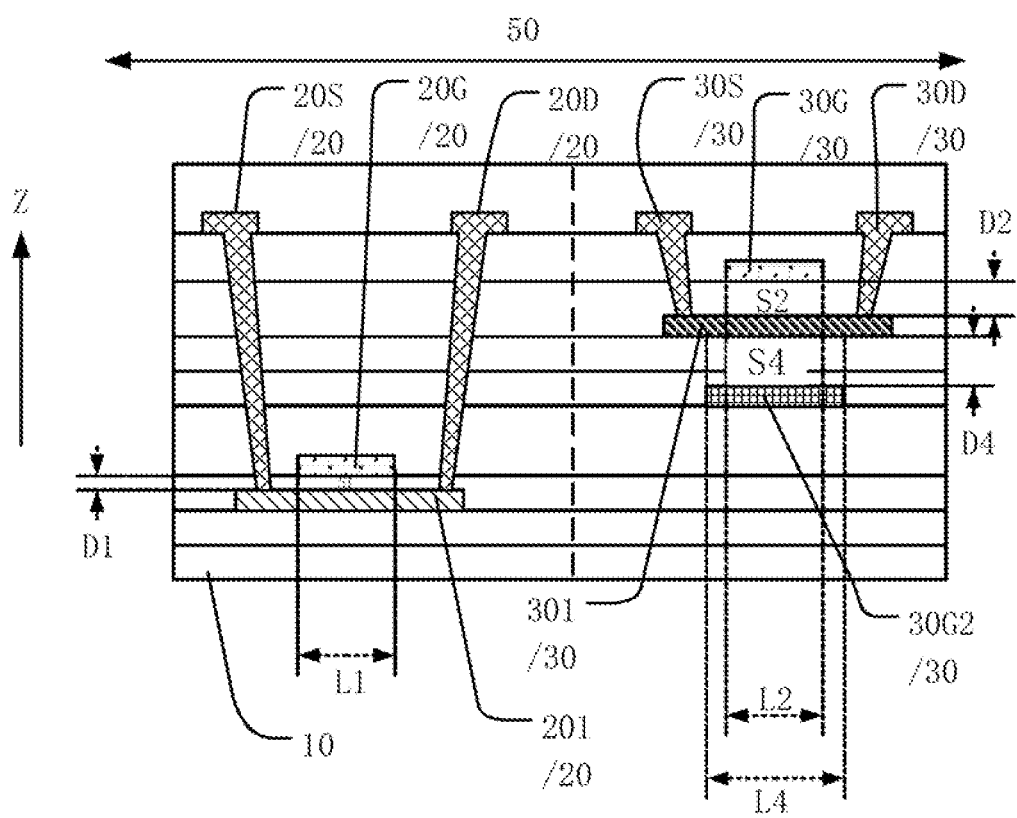
FIG. 11 illustrates another local film-layer cross-sectional structural schematic at a region B in FIG. 1.

In some optional embodiments, referring to FIGS. 1, 10, and 11, FIG. 10 illustrates another local film-layer cross-sectional structural schematic at the region A in FIG. 1; and FIG. 11 illustrates another local film-layer cross-sectional structural schematic at the region B in FIG. 1. In one embodiment, the second transistor 30 may further include a fourth gate electrode 30G2, and along the direction Z perpendicular to the base substrate 10, the distance between the fourth gate electrode 30G2 and the second active layer 301 is D4, where D2<D4. The channel region of the second transistor 30 defined by the second gate electrode 30G may be a second channel region, and the length of the second channel region may be L2. The second channel region may be the region where the second active layer 301 of the second transistor 30 overlaps the second gate electrode 30G, and the length of the second channel region may be the length of the second channel region of the second transistor 30 along the current transmission direction between the second source electrode 30S and the second drain electrode 30D. The channel region of the second transistor 30 defined by the fourth gate electrode 30G2 may be a fourth channel region, and the length of the fourth channel region may be L4. The fourth channel region may be the region where the second active layer 301 of the second transistor 30 overlaps the fourth gate electrode 30G2, and the length of the fourth channel region may be the length of the fourth channel region of the second transistor 30 along the current transmission direction between the second source electrode 30S and the second drain electrode 30D; where the fourth area S4=L4×D4, and S2<S4.

In one embodiment, it may describe that the second transistor 30 (e.g., an oxide semiconductor transistor) may be a double gate transistor. The second transistor 30 may include the second gate electrode 30G and the fourth gate electrode 30G2, and along the direction Z perpendicular to the base substrate 10, the distance D4 between the fourth gate electrode 30G2 and the second active layer 301 may be greater than the distance D2 between the second gate electrode 30G and the second active layer 301. That is, the second transistor 30 of the double gate structure may include two control gate electrodes, the second gate electrode 30G may be the main gate electrode, and the fourth gate electrode 30G2 may be an auxiliary gate electrode. From the structural point of view, it can be considered that two single gate transistors may be connected in series. The added fourth gate electrode 30G2 may have a certain shielding effect, which may make the feedback capacitance between the drain electrode and the second gate electrode 30G become extremely small, thereby being beneficial for improving the display quality of the display panel. Furthermore, in one embodiment, along the direction Z perpendicular to the base substrate 10, the distance D4 between the fourth gate electrode 30G2 and the second active layer 301 may be configured to be greater than the distance D2 between the second gate electrode 30G and the second active layer 301, that is, the insulation layer between the fourth gate electrode 30G2 and the second active layer 301 may be configured to be relatively thick, which may protect the second active layer 301.

In some optional embodiments, referring to FIGS. 1, 10, and 11, the product of the length L4 of the fourth channel region of the second transistor 30 defined by the fourth gate electrode 30G2 of the second transistor 30 and the distance D4 between the fourth gate electrode 30G2 and the second active layer 301 is the fourth area S4; the product of the length L1 of the channel region of the first transistor 20 and the distance D1 between the first gate electrode 20G and the first active layer 201 is the first area S1; and the product of the length L2 of the channel region of the second transistor 30 and the distance D2 between the second gate electrode 30G and the second active layer 301 is the second area S2, where S4+S1>2S2, that is, the sum of the fourth area S4 and the first area S1 is greater than two times of the second area S2.

In one embodiment, it may describe that the difference between the fourth area S4 defined by the fourth gate electrode 30G2 of the second transistor 30 (e.g., an oxide semiconductor transistor) of the double gate structure and the second area S2 defined by the second gate electrode 30G of the second transistor 30 is greater than the difference between the second area S2 defined by the second gate electrode 30G of the second transistor 30 and the first area S1 defined by the first gate electrode 20G of the first transistor 20, that is, S4−S2>S2−S1, S4+S1>2S2. In one embodiment, along the direction Z perpendicular to the base substrate 10, the distance D4 between the fourth gate electrode 30G2 and the second active layer 301 may be configured to be greater than the distance D2 between the second gate electrode 30G and the second active layer 301, that is, the insulation layer between the fourth gate electrode 30G2 and the second active layer 301 may be configured to be relatively thick, which may protect the second active layer 301. Moreover, the fourth area S4 defined by the fourth gate electrode 30G2 may be configured to be relatively large to make the fourth area S4 greater than the second area S2, and the first area S1 and the second area S2 may both be areas defined by the main gates of the transistors. In addition, when the first transistor 20 and the second transistor 30 are used as switch transistors, although there is an area difference between the first transistor 20 and the second transistor 30, the difference may not be configured to be extremely large, that is, S4−S2>S2−S1. In one embodiment, the second transistor 30 may be an oxide semiconductor transistor with a double gate structure. The fourth gate electrode 30G2 may be the auxiliary gate electrode which is located at the bottom of the second active layer 301. The auxiliary gate electrode may improve the stability of the oxide semiconductor transistor and also protect the second active layer 301.

Figure 12:
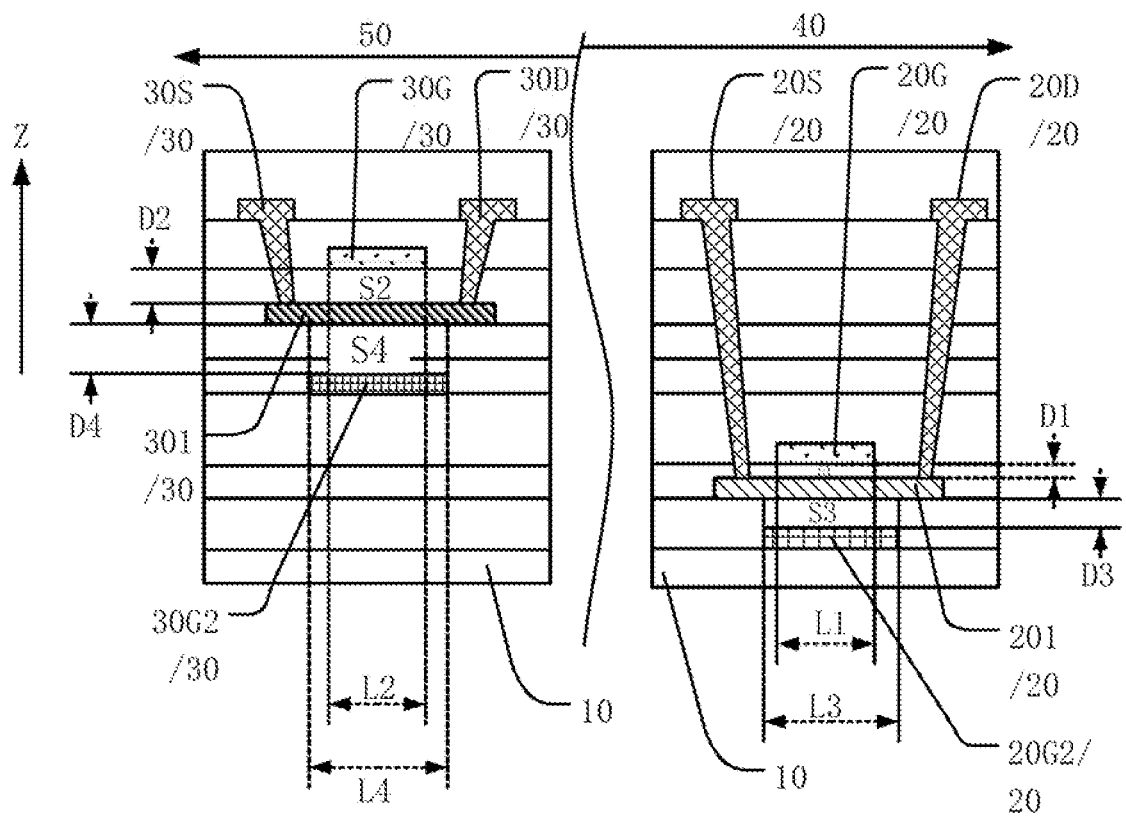
FIG. 12 illustrates another local film-layer cross-sectional structural schematic at a region A in FIG. 1.
Figure 13:
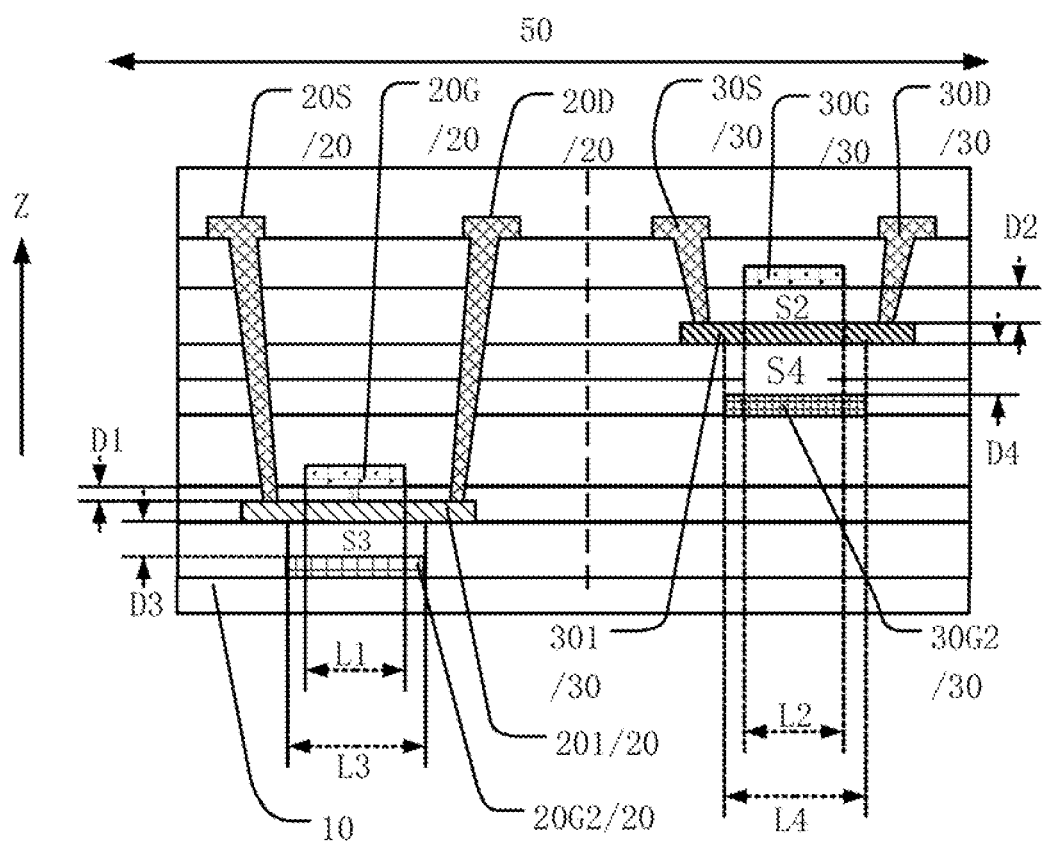
FIG. 13 illustrates another local film-layer cross-sectional structural schematic at a region B in FIG. 1.

In some optional embodiments, referring to FIGS. 1, 12, and 13. FIG. 12 illustrates another local film-layer cross-sectional structural schematic at the region A in FIG. 1; and FIG. 13 illustrates another local film-layer cross-sectional structural schematic at the region B in FIG. 1. In one embodiment, the first transistor 20 may further include a third gate electrode 20G2; along the direction Z perpendicular to the base substrate 10, the distance between the third gate electrode 20G2 and the first active layer 201 is D3, where D1<D3; the channel region of the first transistor 20 defined by the first gate electrode 20G is a first channel region, and the length of the first channel region is L1; the first channel region is a region where the first active layer 201 of the first transistor 20 overlaps the first gate electrode 20G, and the length of the first channel region is the length of the first channel region of the first transistor 20 along the current transmission direction between the first source electrode 20S and the first drain electrode 20D. The channel region of the first transistor 20 defined by the third gate electrode 20G2 is a third channel region, and the length of the third channel region is L3; the third channel region is the region where the first active layer 201 of the first transistor 20 overlaps the third gate electrode 20G2, and the length of the third channel region is the length of the third channel region of the first transistor 20 along the current transmission direction between the first source electrode 20S and the first drain electrode 20D, where the third area S3=L3×D3, and S1<S3.

In one embodiment, it may describe that the first transistor 20 (e.g., a silicon transistor) may be a double gate transistor and include the first gate electrode 20G and the third gate electrode 20G2. Along the direction Z perpendicular to the base substrate 10, the distance D3 between the third gate electrode 20G2 and the first active layer 201 may be greater than the distance D1 between the first gate electrode 20G and the first active layer 201. That is, the first transistor 20 of the double gate structure may include two control gate electrodes, the first gate electrode 20G may be the main gate electrode, and the third gate electrode 20G2 may be an auxiliary gate electrode. From the structural point of view, it can be considered that two single gate transistors may be connected in series. The added third gate electrode 20G2 may have a certain shielding effect, which may make the feedback capacitance between the drain electrode and the first gate electrode 20G become extremely small, thereby being beneficial for improving the display quality of the display panel. Furthermore, in one embodiment, the third area S3 defined by the third gate electrode 20G2 may be configured to be relatively large, and the third area S3 may be greater than the first area S1. That is, the first area S1 defined by the main gate electrode may be less than the third area S3 defined by the auxiliary gate electrode. Along the direction Z perpendicular to the base substrate 10, the distance D3 between the third gate electrode 20G2 and the first active layer 201 may be greater than the distance D1 between the first gate electrode 20G and the first active layer 201, that is, the insulation layer between the third gate electrode 20G2 and the first active layer 201 may be configured to be relatively thick, which may protect the first active layer 201.

In some optional embodiments, referring to FIGS. 1, 12 and 13, the third gate electrode 20G2 of the first transistor 20 may include hydrogen-containing amorphous silicon.

In one embodiment, it may describe that the material of the third gate electrode 20G2 of the first transistor 20 may be amorphous silicon (a-S1:H) containing hydrogen, such that the hydrogen element may be provided to the first active layer 201 of the first transistor 20 (e.g., a silicon transistor) to repair defects in the first active layer 201.

In some optional embodiments, referring to FIGS. 1, 8, 12, and 13, the first transistor 20 may be the drive transistor of the pixel circuit 40, where S3−S1<S4−S2.

In one embodiment, it may describe that the pixel circuit 40 of the display pixel 400 may include the first transistor 20 (e.g., a silicon transistor), and the first transistor 20 may be the drive transistor of the pixel circuit 40. In the organic light-emitting display panel, the first transistor 20 as the drive transistor may be electrically connected to a light-emitting unit, thereby providing an anode voltage signal for the anode of each light-emitting unit. In such way, a certain drive electric field may be formed between the anode and the cathode of the light-emitting unit, thereby implementing the light emission of the light-emitting layer and further implementing the display function.

In one embodiment, the difference between the third area S3 and the first area S1 may be configured to be less than the difference between the fourth area S4 and the second area S2. That is, the first transistor 20 and the second transistor 30 may both be double gate structures; the difference between the third area S3 defined by the bottom gate electrode (the third gate electrode 20G2) of the first transistor 20 and the first area S1 defined by the top gate electrode (the first gate electrode 20G) is S3−S1; and the difference between the fourth area S4 defined by the bottom gate electrode (the fourth gate electrode 30G2) of the second transistor 30 and the second area S2 defined by the top gate electrode (the second gate electrode 30G) is S4−S2. The material of the bottom gate electrode (the third gate electrode 20G2) of the first transistor 20 may include hydrogen-containing amorphous silicon, which may provide the hydrogen element to the first active layer 201 to repair defects in the first active layer 201 and also play a shielding role to prevent the first transistor 20 from being interfered by other elements in the display device. Therefore, compared with the first area S1 defined by the top gate electrode (the first gate electrode 20G), there is no need to configure the third area S3, defined by the bottom gate (the third gate electrode 20G2) of the first transistor 20, to be relatively large, that is, the difference between S3−S1 may be relatively small. Moreover, the material of the second active layer 301 of the second transistor 30 may be an oxide semiconductor material, which is more sensitive than silicon material. Especially, when both the oxide semiconductor transistor and the silicon transistor are disposed in the display panel 000, the silicon transistor may be in an environment with a relatively high hydrogen content, in order to fully protect the oxide semiconductor transistor, the fourth area S4 defined by the bottom gate electrode (an auxiliary gate electrode, i.e., the fourth gate electrode 30G2) may be configured to be relatively large after the second transistor 30 has configured with the double gate structure. Therefore, while the stability of the second transistor 30 is improved, the second active layer 301 of the second transistor 30 may be protected from the influence of hydrogen through the fourth gate electrode 30G2 with a relatively large area, such that S3−S1 may be configured to be less than S4−S2 in one embodiment.

In addition, since the third gate electrode 20G2 of the first transistor 20 in one embodiment is mainly used to supplement hydrogen and perform a shielding function for the first active layer 201 of the first transistor 20, the distance D3 between the third gate electrode 20G2 and the first active layer 201 does not need to be configured to be relatively large along the direction Z perpendicular to the base substrate 10. However, for the second transistor 30, in order to fully protect the oxide semiconductor transistor, the distance D2 between the second gate electrode 30G and the second active layer 301 and the distance D4 between the fourth gate electrode 30G2 and the second active layer 301 may be configured to be larger (that is, the thickness of the insulation layer between the second gate electrode 30G and the second active layer 301 and the thickness of the insulation layer between the fourth gate electrode 30G2 and the second active layer 301 may both be larger), thereby protecting the second transistor 30, which is beneficial for improving the display quality.

Optionally, referring to FIG. 8, FIG. 8 illustrates a structural schematic of the pixel circuit 40 according to various embodiments of the present disclosure. The pixel circuit 40 may include a plurality of switch transistors and drive transistors, a storage capacitor, a light-emitting diode OLED (7T1C). Taking the structure of the pixel circuit 40 as an example, the first transistor 20 (e.g., a silicon transistor) may be the drive transistor M3 in the pixel circuit 40.

Figure 14:
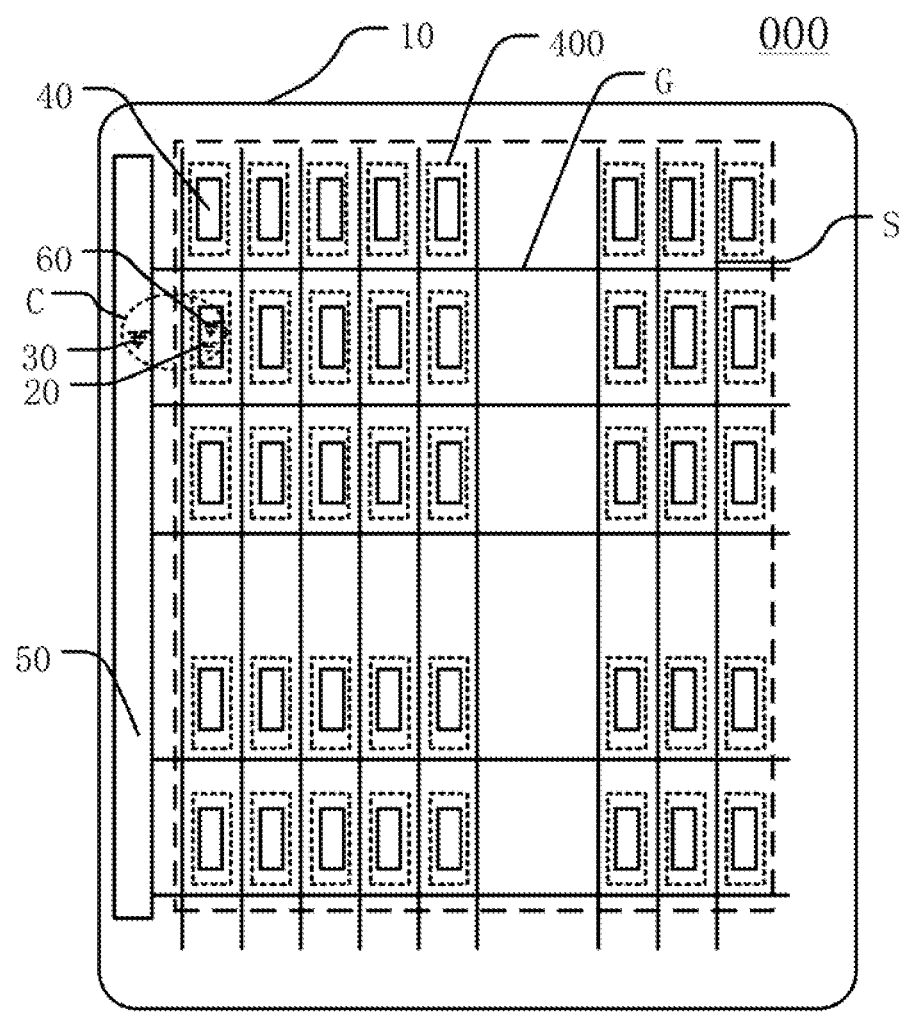
FIG. 14 illustrates another planar structural schematic of a display panel according to various embodiments of the present disclosure.
Figure 15:
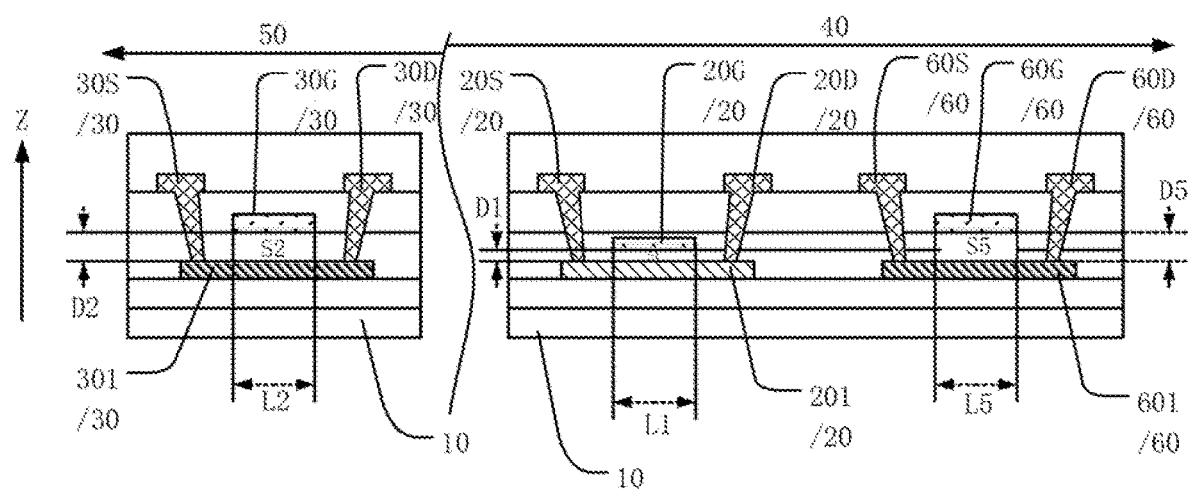
FIG. 15 illustrates a local film-layer cross-sectional structural schematic at a region C in FIG. 14.

In some optional embodiments, referring to FIGS. 14 and 15, FIG. 14 illustrates another planar structural schematic of the display panel according to various embodiments of the present disclosure; and FIG. 15 illustrates a local film-layer cross-sectional structural schematic at a region C in FIG. 14. It should be understood that the local film-layer schematic of a first transistor, a second transistor, and a third transistor may be exemplarily illustrated in FIG. 15. In order to clearly illustrate the technical solution of one embodiment, the first transistor, the second transistor, and the third transistor may be illustrated together for description, which may not indicate the actual positions of the first transistor, the second transistor, and the third transistor in the display panel. During an implementation, the positions and connection relationships of the first transistor, the second transistor, and the third transistor may be determined according to the layout of the drive circuit and the pixel circuit. In one embodiment, the pixel circuit 40 may include a third transistor 60; and the third transistor 60 may include a fifth gate electrode 60G, a third active layer 601, a third source electrode 60S, and a third drain electrode 60D; and the third active layer 601 may include an oxide semiconductor. Along the direction Z perpendicular to the base substrate 10, the distance between the fifth gate electrode 60G and the third active layer 601 is D5, the channel region of the third transistor 60 defined by the fifth gate electrode 60G is a fifth channel region, the length of the fifth channel region is L5, and the fifth area S5=L5×D5; where S1<S5.

In one embodiment, it may describe that the pixel circuit 40 of the display panel 000 may further include the third transistor 60. The third transistor 60 may include the fifth gate electrode 60G, the third active layer 601, the third source electrode 60S, and the third drain electrode 60D. The third active layer 601 may include an oxide semiconductor, that is, the third transistor 60 may be also an oxide semiconductor transistor. The oxide semiconductor material may be amorphous indium gallium zinc oxide (IGZO). The drive circuit 50 may include the second transistor 30 (e.g., an oxide semiconductor transistor), and the pixel circuit 40 may include the third transistor 60 (e.g., also an oxide semiconductor transistor). The length of the channel region of the third transistor 60 is L5, where the channel region of the third transistor 60 may be the region where the third active layer 601 of the third transistor 60 overlaps with the fifth gate electrode 60G, and the length of the channel region of the third transistor 60 may be the length of the channel region of the third transistor 60 along the current transmission direction between the third source electrode 60S and the third drain electrode 60D.

In the display panel 000 provided in one embodiment, along the direction Z perpendicular to the base substrate 10, the distance between the fifth gate electrode 60G and the third active layer 601 is D5, the length of the fifth channel region of the third transistor 60 defined by the fifth gate electrode 60G is L5, the fifth area S5=L5×D5, and S1<S5. Optionally, the distance D1 between the first gate electrode 20G and the first active layer 201 may be configured to be less than the distance D5 between the fifth gate electrode 60G and the third active layer 601; the length L1 of the channel region of the first transistor 20 may be also configured to be less than the length L5 of the channel region of the third transistor 60; and the distance D1 between the first gate electrode 20G and the first active layer 201 may be configured to be less than the distance D5 between the fifth gate electrode 60G and the third active layer 601, and the length L1 of the channel region of the first transistor 20 may be also configured to be less than the length L5 of the channel region of the third transistor 60, thereby realizing that the first area S1 is less than the fifth area S5. In one embodiment, the first transistor 20 may be a silicon transistor, and the third transistor 60 may be an oxide semiconductor transistor; compared with the third transistor 60 (an oxide semiconductor transistor), the first transistor 20 (a silicon transistor) may have a relatively fast carrier mobility rate; the first active layer 201 of the first transistor 20 may include silicon; the third active layer 601 in the third transistor 60 may include an oxide semiconductor; and the silicon transistor may not be sensitive to hydrogen, water and oxygen in the external environment than the oxide semiconductor transistor. Therefore, the distance D1 between the first gate electrode 20G of the first transistor 20 and the first active layer 201 may be configured to be less than the distance D5 between the fifth gate electrode 60G of the third transistor 60 and the third active layer 601 (as shown in FIG. 15). Since the first transistor 20 (e.g., a silicon transistor) has better responsiveness, in order to fully improve the PPI of the display panel 000, the lengths (L1 and L5) of the channel regions of such two types of transistors may be designed to be as small as possible by utilizing the advantages of silicon transistors and oxide semiconductor transistors, which is beneficial for saving circuit space and further beneficial for increasing the PPI of the display panel 000. In one embodiment, along the direction Z perpendicular to the base substrate 10 of the display panel 000, the first area S1 may be configured to be less than the fifth area S5, where the first area S1=L1×D1, the fifth area S5=L5×D5, the distance between the first gate electrode 20G of the first transistor 20 (e.g., a silicon transistor) and the first active layer 201 is D1, and the distance between the fifth gate electrode 60G of the third transistor 60 (e.g., an oxide semiconductor transistor) and the third active layer 601 is D5. Therefore, the features and advantages of silicon transistors and oxide semiconductor transistors may be fully utilized, and while ensuring the stability and normal operation of the transistors, the space of the display panel may be saved and the PPI of the display panel may be improved, which is further beneficial for improving the display quality of the display panel 000 and improving the display effect and the product competitiveness.

Figure 16:
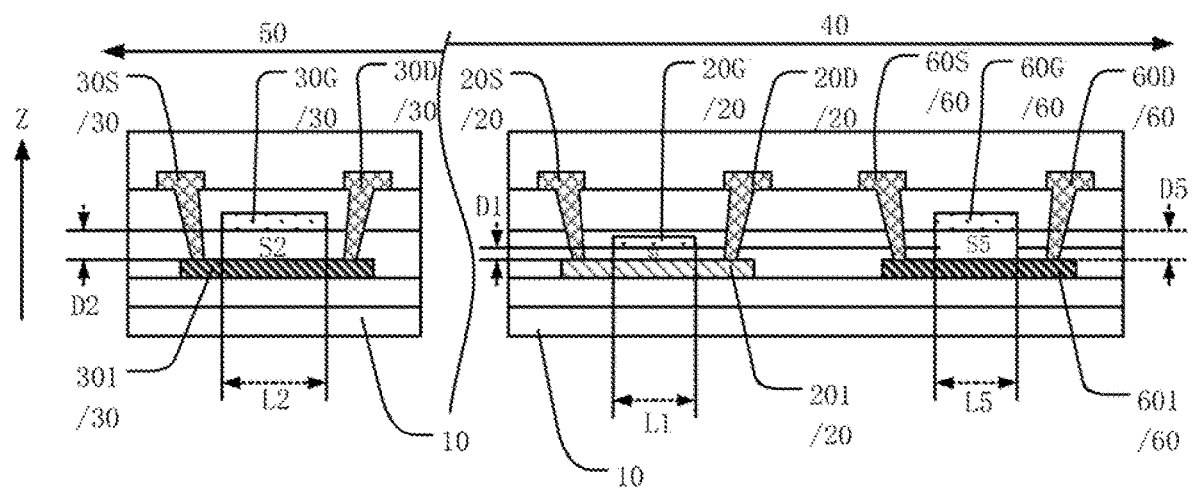
FIG. 16 illustrates another local film-layer cross-sectional structural schematic at a region C in FIG. 14.

In some optional embodiments, referring to FIGS. 8, 14, and 16, FIG. 16 illustrates another local film-layer cross-sectional structural schematic at the region C in FIG. 14. It should be understood that the local film-layer schematic of a first transistor, a second transistor, and a third transistor may be exemplarily illustrated in FIG. 16. In order to clearly illustrate the technical solution of one embodiment, the first transistor, the second transistor, and the third transistor may be illustrated together for description, which may not indicate the actual positions of the first transistor, the second transistor, and the third transistor in the display panel. During an implementation, the positions and connection relationships of the first transistor, the second transistor, and the third transistor may be determined according to the layout of the drive circuit and the pixel circuit. In one embodiment, the third transistor 60 may be a switch transistor of the pixel circuit 40, where S2>S5.

In one embodiment, it may describe that the second area S2 defined by the second gate electrode 30G of the second transistor 30 in the drive circuit 50 may be greater than the fifth area S5 defined by the fifth gate electrode 60G of the third transistor 60 in the pixel circuit 40. When the third transistor 60 (e.g., an oxide semiconductor transistor) is the switch transistor of the pixel circuit 40, the third transistor 60 may only functions as a switch. Therefore, the fifth area S5 defined by the fifth gate electrode 60G of the third transistor 60 may not need to be excessively large and may be configured to be less than the second area S2 defined by the second gate electrode 30G of the second transistor 30 in the drive circuit 50, which may save the space of the display panel and be beneficial for further improving the PPI of the display panel 000. The drive circuits 50 may be disposed on the left and right edges of the display panel 000, or only on a single edge of the display panel 000, or at other positions in the display panel 000, which may have a relatively large arrangement space. Moreover, the drive circuit 50 may be configured to provide signals for the pixel circuit 40. Properly lengthening the length L2 of the channel region of the second transistor 30 (e.g., an oxide semiconductor transistor) (as shown in FIG. 16) may make the second area S2 defined by the second gate electrode 30G of the second transistor 30 relatively large, thereby avoiding problems such as signal delay, distortion and the like of the drive circuit 50, which may be beneficial for improving the reliability of the drive circuit 50.

Optionally, referring to FIG. 8, FIG. 8 illustrates a structural schematic of the pixel circuit 40 according to various embodiments of the present disclosure. The pixel circuit 40 may include a plurality of switch transistors and drive transistors, a storage capacitor, a light-emitting diode OLED (7T1C). Taking the structure of the pixel circuit 40 as an example, any one or more of the switch transistors M1, M2, M4, M5, M6, and M7 in the pixel circuit 40 may be the third transistor 60 (e.g., an oxide semiconductor transistor).

Figure 17:
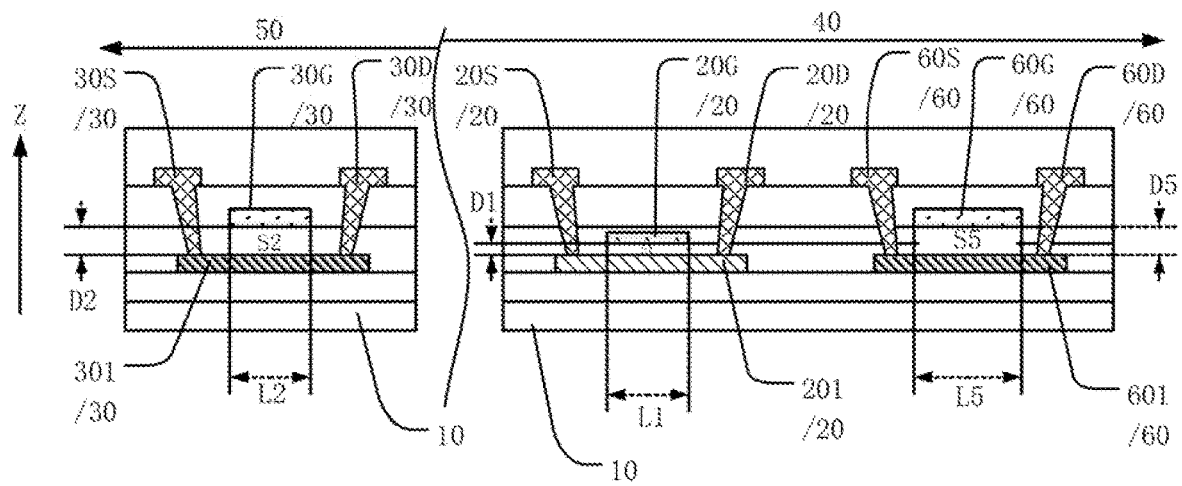
FIG. 17 illustrates another local film-layer cross-sectional structural schematic at a region C in FIG. 14.

In some optional embodiments, referring to FIGS. 8, 14, and 17, FIG. 17 illustrates another local film-layer cross-sectional structural schematic at the region C in FIG. 14. It should be understood that the local film-layer schematic of a first transistor, a second transistor, and a third transistor may be exemplarily illustrated in FIG. 17. In order to clearly illustrate the technical solution of one embodiment, the first transistor, the second transistor, and the third transistor may be illustrated together for description, which may not indicate the actual positions of the first transistor, the second transistor, and the third transistor in the display panel. During an implementation, the positions and connection relationships of the first transistor, the second transistor, and the third transistor may be determined according to the layout of the drive circuit and the pixel circuit. In one embodiment, the third transistor 60 may be a drive transistor of the pixel circuit 40, where S2<S5.

In one embodiment, it may describe that the second area S2 defined by the second gate electrode 30G of the second transistor 30 in the drive circuit 50 may be less than the fifth area S5 defined by the fifth gate electrode 60G of the third transistor 60 in the pixel circuit 40. When the third transistor 60 (e.g., an oxide semiconductor transistor) is the drive transistor of the pixel circuit 40, the drive transistor is the core element of the pixel circuit 40 to provide a drive current for the pixel circuit 40, and before providing the drive current for the display pixel 400 of the pixel circuit 40, there is a need to store the data voltage signal through the gate electrode of the drive transistor in the data write stage. Therefore, in one embodiment, the fifth area S5 defined by the fifth gate electrode 60G of the third transistor 60 used as the drive transistor may be configured to be relatively large, and the length L5 of the channel region of the third transistor 60 (e.g., an oxide semiconductor transistor) may be appropriately lengthened (e.g., shown in FIG. 17), which may make the third transistor 60 used as the drive transistor have a relatively stable threshold voltage and improve the stability of the gate electrode potential, thereby being beneficial for better realizing the storage of the data voltage signal by the gate electrode of the drive transistor.

Optionally, referring to FIG. 8, FIG. 8 illustrates a structural schematic of the pixel circuit 40 according to various embodiments of the present disclosure. The pixel circuit 40 may include a plurality of switch transistors and drive transistors, a storage capacitor, and a light-emitting diode OLED (7T1C). Taking the structure of the pixel circuit 40 as an example, the third transistor 60 (e.g., an oxide semiconductor transistor) may be the drive transistor M3 in the pixel circuit 40.

Figure 18:
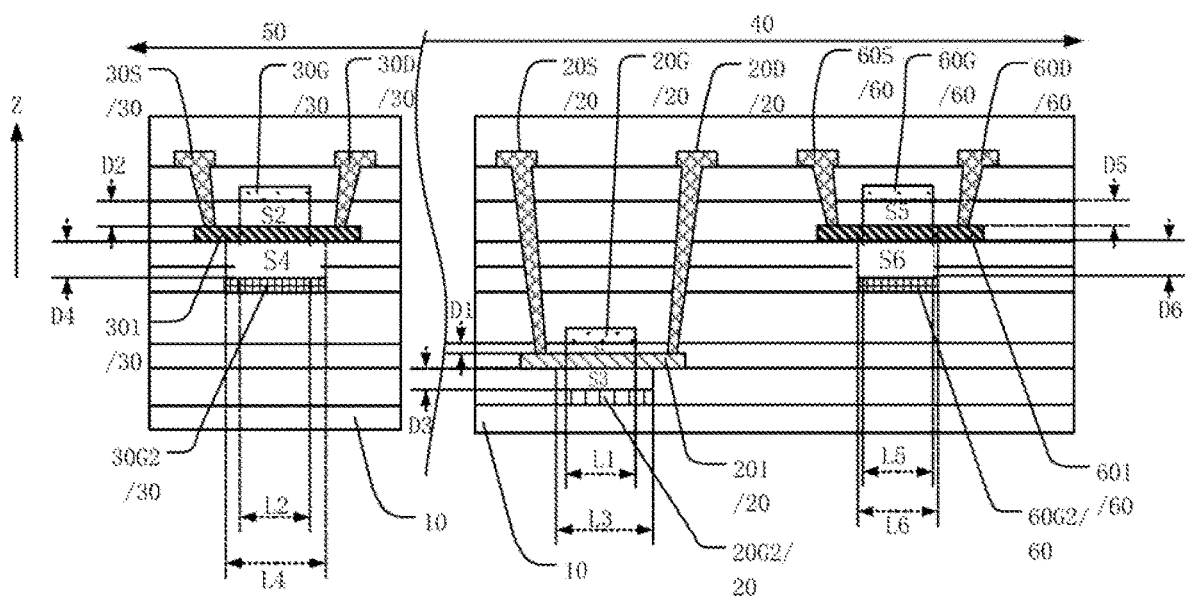
FIG. 18 illustrates another local film-layer cross-sectional structural schematic at a region C in FIG. 14.

In some optional embodiments, referring to FIGS. 14 and 18, FIG. 18 illustrates another local film-layer cross-sectional structural schematic at the region C in FIG. 14. In one embodiment, the third transistor 60 may further include a sixth gate electrode 60G2. Along the direction Z perpendicular to the base substrate 10, the distance between the fifth gate electrode 60G and the third active layer 601 is D5, the channel region of the third transistor 60 defined by the fifth gate electrode 60G is the fifth channel region, the length of the fifth channel region is L5, and the fifth area S5=L5×D5. Along the direction Z perpendicular to the base substrate 10, the distance between the sixth gate electrode 60G2 and the third active layer 601 is D6, where D5<D6. The channel region of the third transistor 60 defined by the sixth gate electrode 60G2 is a sixth channel region, the length of the sixth channel region is L6, the sixth channel region is the region where the third active layer 601 of the third transistor 60 overlaps the sixth gate electrode 60G2, and the length of the sixth channel region is the length of the sixth channel region of the third transistor 60 along the current transmission direction between the third source electrode 60S and the third drain electrode 60D. The channel region of the third transistor 60 defined by the sixth gate electrode 60G2 is the sixth channel region, the length of the sixth channel region is L6, and the sixth area S6=L6×D6; where S5<S6.

In one embodiment, it may describe that the third transistor 30 (e.g., an oxide semiconductor transistor) in the pixel circuit 40 may be a double gate transistor. The third transistor 60 may include the fifth gate electrode 60G and the sixth gate electrode 60G2, and along the direction Z perpendicular to the base substrate 10, the distance D6 between the sixth gate electrode 60G2 and the third active layer 601 may be greater than the distance D5 between the fifth gate electrode 60G and the third active layer 601. That is, the third transistor 60 of the double gate structure may include two control gate electrodes, the fifth gate electrode 60G may be the main gate electrode, and the sixth gate electrode 60G2 may be an auxiliary gate electrode. From the structural point of view, it can be considered that two single gate transistors may be connected in series. The added sixth gate electrode 60G2 may have a certain shielding effect, which may make the feedback capacitance between the drain electrode and the fifth gate electrode 60G become extremely small, thereby being beneficial for improving the display quality of the display panel. Furthermore, in one embodiment, along the direction Z perpendicular to the base substrate 10, the distance D6 between the sixth gate electrode 60G2 and the third active layer 601 may be configured to be greater than the distance D5 between the fifth gate electrode 60G and the third active layer 601, that is, the insulation layer between the sixth gate electrode 60G2 and the third active layer 601 may be configured to be relatively thick, which may protect the third active layer 601.

In some optional embodiments, refer to FIGS. 8, 14, and 18, the third transistor 60 may be a switch transistor of the pixel circuit 40, where S6<S4.

In one embodiment, it may describe that when the third transistor 60 in the pixel circuit 40 is used as a switch transistor, compared with the second transistor 30 in the drive circuit 50, the sixth area S6 defined by the sixth gate electrode 60G2 of the third transistor 60 of the double gate structure may be less than the fourth area S4 defined by the fourth gate electrode 30G2 of the second transistor 30 of the double gate structure. Since various structures in the pixel circuits in the display region of the display panel 000 are relatively complicated, in one embodiment, when the third transistor 60 is used as a switch transistor, the sixth area S6 defined by the sixth gate electrode 60G2 of the third transistor 60 in the pixel circuit 40 may be relatively small, which may reduce the load caused by the parasitic capacitance of the pixel circuit 4 and be beneficial for improving the response speed of the pixel circuit 40 and reducing the hysteresis problem. Moreover, the drive circuits 50 may be disposed on the left and right edges of the display panel 000, or only on a single edge of the display panel 000, or at other positions in the display panel 000, which may have a relatively large arrangement space. Therefore, in one embodiment, the fourth area S4 defined by the fourth gate electrode 30G2 of the second transistor 30 may be configured to be relatively large, that is, S6<S4, which may be beneficial for improving the reliability of the drive circuit 50.

Optionally, referring to FIG. 8, FIG. 8 illustrates a structural schematic of the pixel circuit 40 according to various embodiments of the present disclosure. The pixel circuit 40 may include a plurality of switch transistors and drive transistors, a storage capacitor, a light-emitting diode OLED (7T1C). Taking the structure of the pixel circuit 40 as an example, any one or more of the switch transistors M1, M2, M4, M5, M6, and M7 in the pixel circuit 40 may be the third transistor 60 (e.g., an oxide semiconductor transistor).

In some optional embodiments, referring to FIGS. 8, 14, and 18, the third transistor 60 may be a switch transistor of the pixel circuit 40, where S4−S2>S6−S5.

In one embodiment, it may describe that when the third transistor 60 in the pixel circuit 40 is used as a switch transistor, compared with the second transistor 30 in the drive circuit 50, the difference between the sixth area S6 defined by the sixth gate electrode 60G2 of the third transistor 60 (e.g., an oxide semiconductor transistor) of the double gate structure and the fifth area S5 defined by the fifth gate electrode 60G of the third transistor 60 may be less than the difference between the fourth area S4 defined by the fourth gate electrode 30G2 of the second transistor 30 and the second area S2 defined by the second gate electrode 30G of the second transistor 30 (e.g., an oxide semiconductor transistor) of the double gate structure. Since various structures in the pixel circuits in the display region of the display panel 000 are relatively complicated, in one embodiment, when the third transistor 60 is used as a switch transistor, the sixth area S6 defined by the sixth gate electrode 60G2 of the third transistor 60 and the fifth area S5 defined by the fifth gate electrode 60G may both be relatively small, that is, the difference between S6−S5 may also be relatively small, which may reduce the load caused by the parasitic capacitance of the pixel circuit 4 and be beneficial for improving the response speed of the pixel circuit 40 and reducing the hysteresis problem. Moreover, the drive circuits 50 may be disposed on the left and right edges of the display panel 000, or only on a single edge of the display panel 000, or at other positions in the display panel 000, which may have a relatively large arrangement space. Therefore, in one embodiment, the fourth area S4 defined by the fourth gate electrode 30G2 of the second transistor 30 and the second area S2 defined by the second gate electrode 30G may be both configured to be relatively large, that is, the difference between S4−S2 may also be relatively large to make S4−S2>S6−S5, which may be beneficial for improving the reliability of the drive circuit 50.

Optionally, referring to FIG. 8, FIG. 8 illustrates a structural schematic of the pixel circuit 40 according to various embodiments of the present disclosure. The pixel circuit 40 may include a plurality of switch transistors and drive transistors, a storage capacitor, a light-emitting diode OLED (7T1C). Taking the structure of the pixel circuit 40 as an example, the third transistor 60 (e.g., an oxide semiconductor transistor) may be any one or more of the switch transistors M1, M2, M4, M5, M6, and M7 in the pixel circuit 40.

Figure 19:
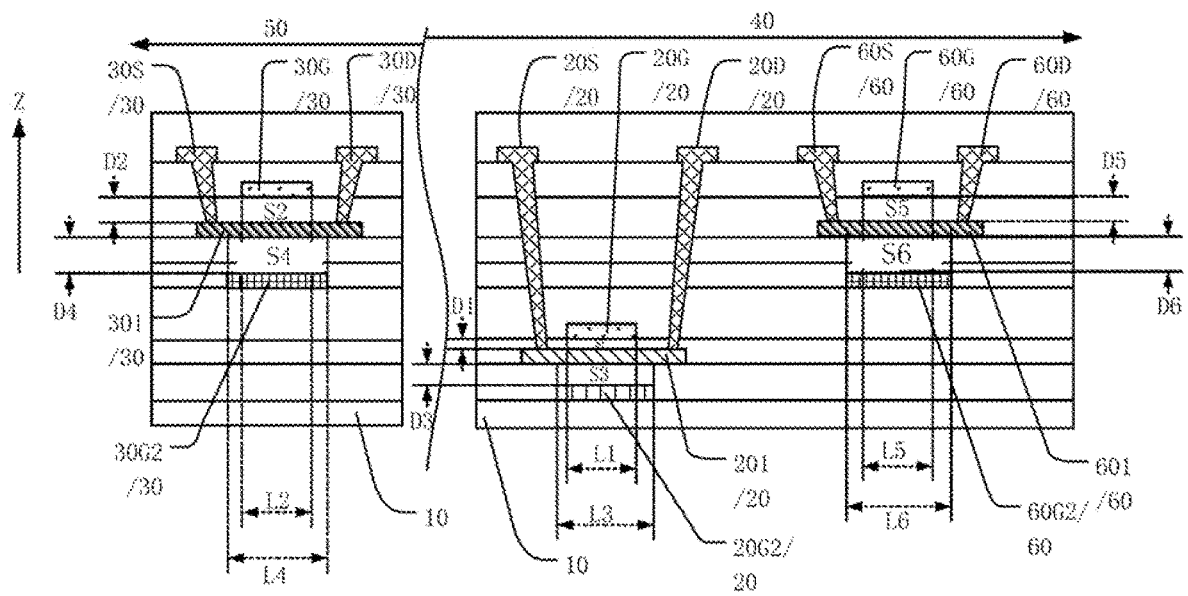
FIG. 19 illustrates another local film-layer cross-sectional structural schematic at a region C in FIG. 14.

In some optional embodiments, referring to FIGS. 8, 14 and 19, FIG. 19 illustrates another local film-layer cross-sectional structural schematic at the region C in FIG. 14. In one embodiment, the third transistor 60 may be the drive transistor of the pixel circuit 40, where S6>S4.

In one embodiment, it may further describe that when the third transistor 60 in the pixel circuit 40 is used as a drive transistor, the fourth area S4 defined by the fourth gate electrode 30G2 (the auxiliary gate electrode) of the second transistor 30 in the drive circuit 50 may be less than the sixth area S6 defined by the sixth gate electrode 60G2 (the auxiliary gate electrode) of the third transistor 60 in the pixel circuit 40. When the third transistor 60 (e.g., an oxide semiconductor transistor) is the drive transistor of the pixel circuit 40, the drive transistor is the core element of the pixel circuit 40 to provide a drive current for the pixel circuit 40, and before providing the drive current for the display pixel 400 of the pixel circuit 40, there is a need to store the data voltage signal through the gate electrode of the drive transistor in the data write stage. Therefore, in one embodiment, the sixth area S6 defined by the sixth gate electrode 60G2 (the auxiliary gate electrode) of the third transistor 60 used as the drive transistor may be configured to be relatively large, and the length L5 of the channel region of the third transistor 60 (e.g., an oxide semiconductor transistor) may be appropriately lengthened (e.g., shown in FIG. 19), which may make the third transistor 60 used as the drive transistor have a relatively stable threshold voltage and improve the stability of the gate electrode potential, thereby being beneficial for better realizing the storage of the data voltage signal by the gate electrode of the drive transistor.

Optionally, referring to FIG. 8, FIG. 8 illustrates a structural schematic of the pixel circuit 40 according to various embodiments of the present disclosure. The pixel circuit 40 may include a plurality of switch transistors and drive transistors, a storage capacitor, and a light-emitting diode OLED (7T1C). Taking the structure of the pixel circuit 40 as an example, the third transistor 60 (e.g., an oxide semiconductor transistor) may be the drive transistor M3 in the pixel circuit 40.

Figure 20:
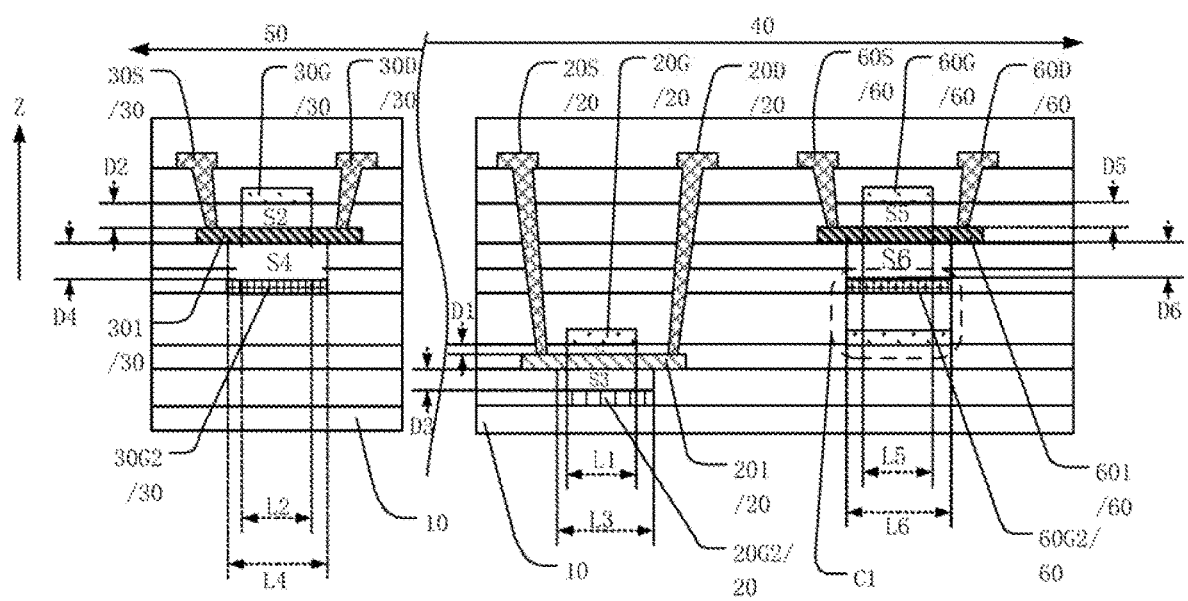
FIG. 20 illustrates another local film-layer cross-sectional structural schematic at a region C in FIG. 14.

In some optional embodiments, referring to FIGS. 8, 14, and 20, FIG. 20 illustrates another local film-layer cross-sectional structural schematic at the region C in FIG. 14. In one embodiment, the pixel circuit 40 may further include a first capacitor C1; and the first capacitor C1 may be configured to store the data voltage transmitted to the gate electrode of the third transistor 60. The sixth gate electrode 60G2 (the auxiliary gate electrode) of the third transistor 60 may be multiplexed as a plate of the first capacitor C1. Optionally, the other plate of the first capacitor C1 may be disposed at a same layer as other metal conductive film-layers and arranged opposite to the sixth gate electrode 60G2. As shown in FIG. 20, the other plate of the first capacitor C1 may be disposed at a same layer as the first gate electrode 20G of the first transistor 20

In one embodiment, it may describe that the pixel circuit 40 may further include the first capacitor C1 used as the storage capacitor for storing the data voltage transmitted to the gate of the third transistor 60, and the sixth gate electrode 60G2 (the auxiliary gate electrode) of the third transistor 60 may be multiplexed as a plate of the first capacitor C1. The sixth area S6 defined by the sixth gate electrode 60G2 (the auxiliary gate electrode) of the third transistor 60 in the pixel circuit 40 is greater than the fourth area S4 defined by the fourth gate electrode 30G2 (the auxiliary gate electrode) of the second transistor 30 in the drive circuit 50, such that the relative area of two plates of the first capacitor C1 may be relatively large, which may be beneficial for improving the storage capacity of the first capacitor C1 to make the storage capacitor have better storage capacity, thereby improving the drive effect of the pixel circuit 40.

Optionally, referring to FIG. 8, FIG. 8 illustrates a structural schematic of the pixel circuit 40 according to various embodiments of the present disclosure. The pixel circuit 40 may include a plurality of switch transistors and drive transistors, a storage capacitor, and a light-emitting diode OLED (7T1C). Taking the structure of the pixel circuit 40 as an example, the first capacitor may be the storage capacitor Cst in the pixel circuit 40.

Figure 21:
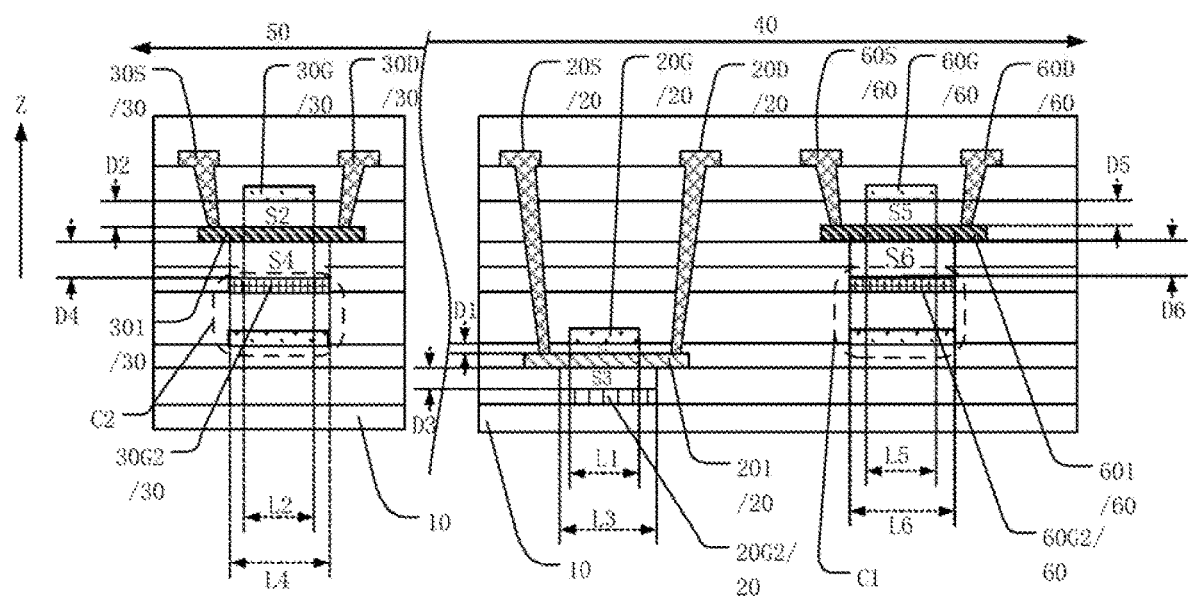
FIG. 21 illustrates another local film-layer cross-sectional structural schematic at a region C in FIG. 14.

In some optional embodiments, referring to FIGS. 14 and 21, FIG. 21 illustrates another local film-layer cross-sectional structural schematic at the region C in FIG. 14. In on embodiment, the drive circuit 50 may further include a second capacitor C2, where the fourth gate electrode 30G2 may be multiplexed as a plate of the second capacitor C2. Optionally, the other plate of the second capacitor C2 may be disposed at a same layer as other metal conductive film-layers and arranged opposite to the fourth gate electrode 30G2. As shown in FIG. 21, the other plate of the second capacitor C2 may be disposed at a same layer as the first gate electrode 20G of the first transistor 20, and the capacitance value of the first capacitor C1 may be greater than the capacitance value of the second capacitor C2.

In one embodiment, it may describe that the drive circuit 50 may further include the second capacitor C2; the second transistor 30 in the drive circuit 50 may be electrically connected to the second capacitor C2; and the fourth gate electrode 30G2 of the second transistor 30 may be multiplexed as a plate of the second capacitor C2. In one embodiment, the capacitance value of the first capacitor C1 may be configured to be greater than the capacitance value of the second capacitor C2. The first capacitor C1 is a storage capacitor in the pixel circuit 40 for storing the data voltage signals, and the capability to store the data voltage signals may directly determine the drive current of the light-emitting element in the display pixel 400. Therefore, the first capacitor C1 used as the storage capacitor in the pixel circuit 40 may need a relatively large capacitance value, which may then enable the first capacitor C1 to have a relatively high storage capacity. However, the second capacitor C2 in the drive circuit 50 may be configured for stabilizing a node potential, and the storage capacity requirement of the second capacitor C2 may be lower than the first capacitor C1 used as the storage capacitor in the pixel circuit 40. Thus, in one embodiment, the capacitance value of the first capacitor C1 may be configured to be greater than the capacitance value of the second capacitor C2, which may satisfy the relatively high storage capacity of the first capacitor C1 and the requirement of stabilizing the node potential in the drive circuit 50.

In some optional embodiments, referring to FIGS. 8, 14 and 21, the third transistor 60 may be the drive transistor of the pixel circuit 40, where S4−S2<S6−S5.

In one embodiment, it may describe that when the third transistor 60 in the pixel circuit 40 is used as the drive transistor, compared with the second transistor 30 in the drive circuit 50, the difference between the sixth area S6 defined by the sixth gate electrode 60G2 of the third transistor 60 (e.g., an oxide semiconductor transistor) of the double gate structure and the fifth area S5 defined by the fifth gate electrode 60G of the third transistor 60 may be greater than the difference between the fourth area S4 defined by the fourth gate electrode 30G2 of the second transistor 30 (e.g., an oxide semiconductor transistor) of the double gate structure and the second area S2 defined by the second gate electrode 30G of the second transistor 30. When the third transistor 60 (e.g., an oxide semiconductor transistor) is the drive transistor of the pixel circuit 40, the drive transistor is the core element of the pixel circuit 40 to provide a drive current for the pixel circuit 40, and before providing the drive current for the display pixel 400 of the pixel circuit 40, there is a need to store the data voltage signal through the gate electrode of the drive transistor in the data write stage. Therefore, in one embodiment, the sixth area S6 defined by the sixth gate electrode 60G2 (the auxiliary gate electrode) of the third transistor 60 used as the drive transistor and the fifth area S5 defined by the fifth gate electrode 60G may both be configured to be relatively large, and the lengths L5 and L6 of the channel regions of the third transistor 60 (e.g., an oxide semiconductor transistor) may be appropriately lengthened (e.g., shown in FIG. 21) to make S6−S5>S4−S2, which may make the third transistor 60 used as the drive transistor have a relatively stable threshold voltage, improve the stability of the gate electrode potential, thereby being beneficial for better realizing the storage of the data voltage signal by the gate electrode of the drive transistor.

Optionally, referring to FIG. 8, FIG. 8 illustrates a structural schematic of the pixel circuit 40 according to various embodiments of the present disclosure. The pixel circuit 40 may include a plurality of switch transistors and drive transistors, a storage capacitor, and a light-emitting diode OLED (7T1C). Taking the structure of the pixel circuit 40 as an example, the third transistor 60 (e.g., an oxide semiconductor transistor) may be the drive transistor M3 in the pixel circuit 40.

Figure 22:
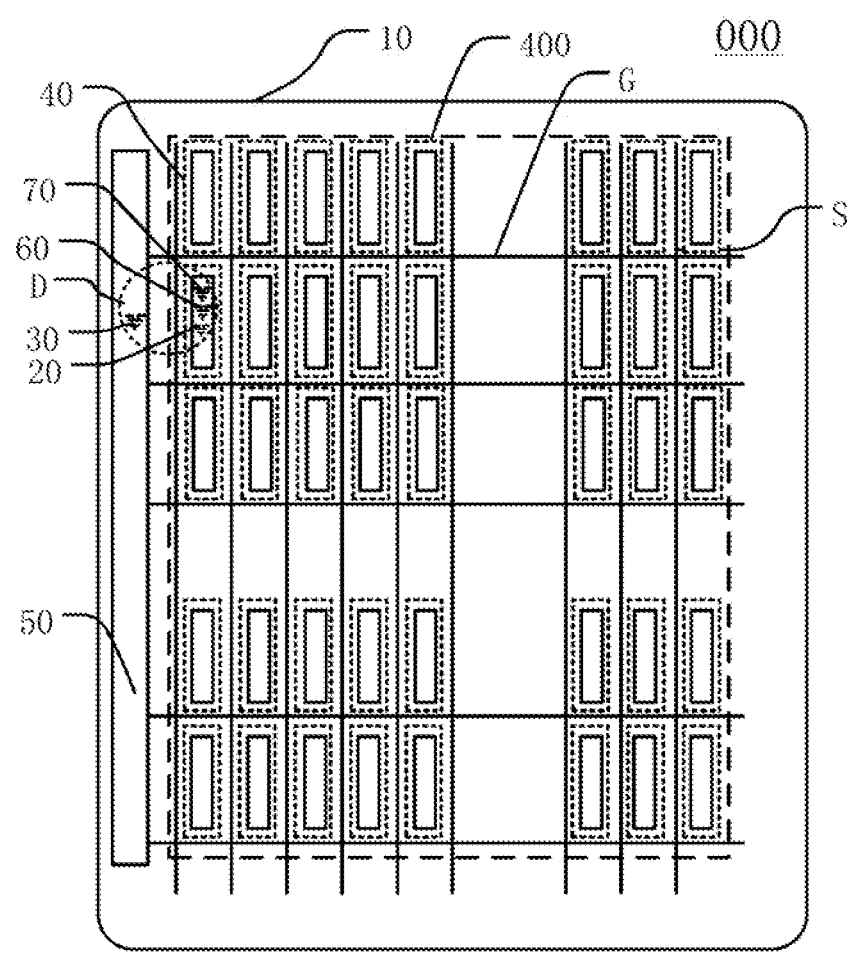
FIG. 22 illustrates another planar structural schematic of a display panel according to various embodiments of the present disclosure.
Figure 23:
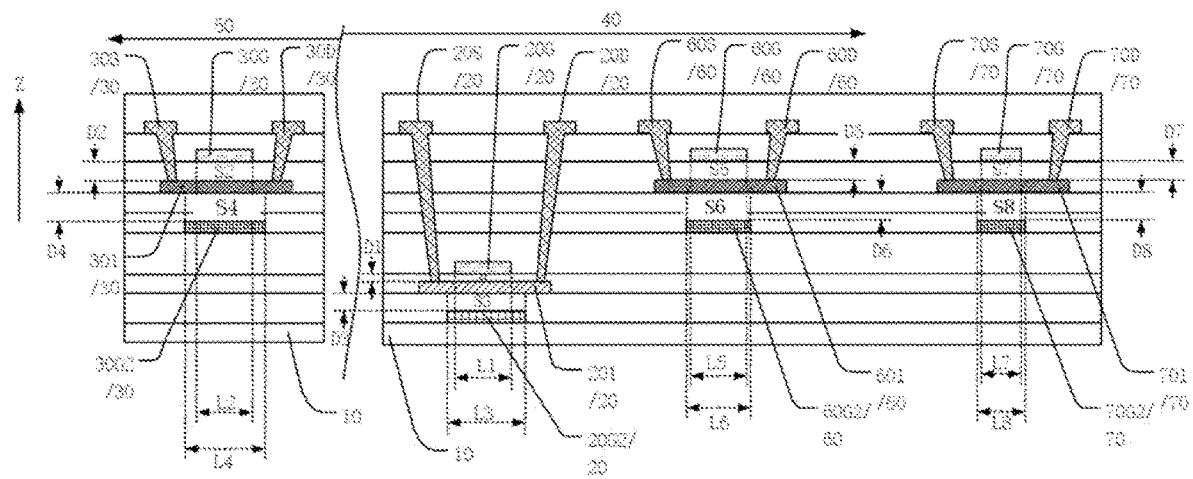
FIG. 23 illustrates a local film-layer cross-sectional structural schematic at a region D in FIG. 22.

In some optional embodiments, referring to FIGS. 22 and 23, FIG. 22 illustrates another planar structural schematic of the display panel according to various embodiments of the present disclosure; and FIG. 23 illustrates a local film-layer cross-sectional structural schematic at a region D in FIG. 22. It should be understood that the local film-layer schematic of a first transistor, a second transistor, a third transistor, and a fourth transistor may be exemplarily illustrated in FIG. 23. In order to clearly illustrate the technical solution of one embodiment, the first transistor, the second transistor, the third transistor, and the fourth transistor may be illustrated together for description, which may not indicate the actual positions of the first transistor, the second transistor, the third transistor, and the fourth transistor in the display panel. During an implementation, the positions and connection relationships of the first transistor, the second transistor, the third transistor, and the fourth transistor may be determined according to the layout of the drive circuit and the pixel circuit. In the display panel 000 provided in one embodiment, the pixel circuit 40 may further include a fourth transistor 70.

The fourth transistor 70 may include a seventh gate electrode 70G, a fourth active layer 701, a fourth source electrode 70S, and a fourth drain electrode 70D; and the fourth active layer 701 may include an oxide semiconductor.

Along the direction Z perpendicular to the base substrate 10, the distance between the seventh gate electrode 70G and the fourth active layer 701 is D7, the channel region of the fourth transistor 70 defined by the seventh gate electrode 70G is a seventh channel region, the length of the seventh channel region is L7, and the seventh area S7=L7×D7.

The fourth transistor 70 may further include an eighth gate electrode 70G2. Along the direction Z perpendicular to the base substrate 10, the distance between the eighth gate electrode 70G2 and the fourth active layer 701 is D8, the channel region of the fourth transistor 70 defined by the eighth gate electrode 70G2 is an eighth channel region, the length of the eighth channel region is L8, and the eighth area S8=L8×D8, where D7<D8, and S7<S8.

In one embodiment, it may describe that the pixel circuit 40 may further include the fourth transistor 70; and the fourth transistor 70 may include the seventh gate electrode 70G, the fourth active layer 701, the fourth source electrode 70S, and the fourth drain electrode 70D. The fourth active layer 701 may include an oxide semiconductor, that is, the fourth transistor 70 may be an oxide semiconductor transistor, and the oxide semiconductor material may be an amorphous indium gallium zinc oxide (IGZO). The channel region of the fourth transistor 70 defined by the seventh gate electrode 70G of the fourth transistor 70 is the seventh channel region, and the length of the seventh channel region is L7. The seventh channel region of the fourth transistor 70 is a region where the fourth active layer 701 of the fourth transistor 70 overlaps with the seventh gate electrode 70G; and the length of the seventh channel region of the fourth transistor 70 is the length of the seventh channel region of the fourth transistor 70 along the current transmission direction between the fourth source electrode 70S and the fourth drain electrode 70D. The fourth transistor 70 may be a transistor with a double gate structure, and the fourth transistor 70 may further include the eighth gate electrode 70G2. Along the direction Z perpendicular to the base substrate 10, the distance between the eighth gate electrode 70G2 and the fourth active layer 701 is D8, the channel region of the fourth transistor 70 defined by the eighth gate electrode 70G2 is the eighth channel region, and the length of the eighth channel region is L8. The eighth channel region of the fourth transistor 70 is a region where the fourth active layer 701 of the fourth transistor 70 overlaps the eighth gate electrode 70G2; and the length of the eighth channel region of the fourth transistor 70 is the length of the eighth channel region of the fourth transistor 70 along the current transmission direction between the fourth source electrode 70S and the fourth drain electrode 70D. In one embodiment, the pixel circuit 40 may include the first transistor 20 (e.g., a silicon transistor) of the double gate structure, the third transistor 60 (e.g., an oxide semiconductor transistor), and the fourth transistor 70 (e.g., an oxide semiconductor transistor). That is, the fourth transistor 70 of the double gate structure may include two control gate electrodes, the seventh gate electrode 70G may be the main gate electrode, and the eighth gate electrode 70G2 may be an auxiliary gate electrode. From the structural point of view, it can be considered that two single gate transistors may be connected in series. The added eighth gate electrode 70G2 may have a certain shielding effect, which may make the feedback capacitance between the drain electrode and the seventh gate electrode 70G become extremely small, thereby being beneficial for improving the display quality of the display panel.

In one embodiment, along the direction Z perpendicular to the base substrate 10, the distance D7 between the seventh gate electrode 70G (the main gate electrode) and the fourth active layer 701 may be less than the distance D8 between the eighth gate electrode 70G2 (the auxiliary gate electrode) and the fourth active layer 701; and the seventh area S7 defined by the seventh gate electrode 70G may be less than the eighth area S8 defined by the eighth gate electrode 70G2. In such way, the insulation layer between the eighth gate electrode 70G2 and the fourth active layer 701 may be configured to be relatively thick, which may protect the fourth active layer 701.

In some optional embodiments, referring to FIGS. 8, 22, and 23, the third transistor 60 may be a drive transistor, and the fourth transistor 70 may be a switch transistor, where S6>S8.

In one embodiment, it may describe that when the third transistor 60 in the pixel circuit 40 is used as a drive transistor and the fourth transistor 70 is used as a switch transistor, the eighth area S8 defined by the eighth gate electrode 70G2 (the auxiliary gate electrode) of the fourth transistor 70 may be less than the sixth area S6 defined by the sixth gate electrode 60G2 (the auxiliary gate electrode) of the third transistor 60. When the third transistor 60 (e.g., an oxide semiconductor transistor) is the drive transistor of the pixel circuit 40, the drive transistor is the core element of the pixel circuit 40 to provide a drive current for the pixel circuit 40, and before providing the drive current for the display pixel 400 of the pixel circuit 40, there is a need to store the data voltage signal through the gate electrode of the drive transistor in the data write stage. Therefore, in one embodiment, the sixth area S6 defined by the sixth gate electrode 60G2 (the auxiliary gate electrode) of the third transistor 60 used as the drive transistor may be configured to be relatively large, and the length L6 of the channel region of the third transistor 60 (e.g., an oxide semiconductor transistor) may be appropriately lengthened (e.g., shown in FIG. 23), which may make the third transistor 60 used as the drive transistor have a relatively stable threshold voltage and improve the stability of the gate electrode potential, thereby being beneficial for better realizing the storage of the data voltage signal by the gate electrode of the drive transistor. However, when the fourth transistor 70 of the oxide semiconductor transistor is used as the switch transistor of the pixel circuit 40, the fourth transistor 70 may only function as a switch, such that the eighth area S8 defined by the eighth gate electrode 70G2 (the auxiliary gate electrode) of the fourth transistor 70 may not need to be excessively large, which may save the space of the display panel and be beneficial for improving the PPI of the display panel 000.

Optionally, referring to FIG. 8, FIG. 8 illustrates a structural schematic of the pixel circuit 40 according to various embodiments of the present disclosure. The pixel circuit 40 may include a plurality of switch transistors and drive transistors, a storage capacitor, and a light-emitting diode OLED (7T1C). Taking the structure of the pixel circuit 40 as an example, the third transistor 60 (e.g., an oxide semiconductor transistor) may be the drive transistor M3 in the pixel circuit 40; and the fourth transistor 70 (e.g., an oxide semiconductor transistor) may be any one or more of the switch transistors M1, M2, M4, M5, M6, and M7 in the pixel circuit 40.

In some optional embodiments, referring to FIGS. 8, 22, and 23, the third transistor 60 may be a drive transistor, and the fourth transistor 70 may be a switch transistor, where S6−S5>S8−S7.

In one embodiment, it may describe that when the third transistor 60 in the pixel circuit 40 is used as a drive transistor and the fourth transistor 70 is used as a switch transistor, the difference between the sixth area S6 defined by the sixth gate electrode 60G2 of the third transistor 60 (e.g., an oxide semiconductor transistor) of the double gate structure and the fifth area S5 defined by the fifth gate electrode 60G of the third transistor 60 may be greater than the difference between the eighth area S8 defined by the eighth gate electrode 70G2 (the auxiliary gate electrode) of the fourth transistor 70 (e.g., an oxide semiconductor transistor) of the double gate structure and the seventh area S7 defined by the seventh gate electrode 70G of the fourth transistor 70. When the third transistor 60 (e.g., an oxide semiconductor transistor) is the drive transistor of the pixel circuit 40, the drive transistor is the core element of the pixel circuit 40 to provide a drive current for the pixel circuit 40, and before providing the drive current for the display pixel 400 of the pixel circuit 40, there is a need to store the data voltage signal through the gate electrode of the drive transistor in the data write stage. Therefore, in one embodiment, the sixth area S6 defined by the sixth gate electrode 60G2 (the auxiliary gate electrode) of the third transistor 60 used as the drive transistor and the fifth area S5 defined by the fifth gate electrode 60G may both be configured to be relatively large, and the lengths L5 and L6 of the channel regions of the third transistor 60 (e.g., an oxide semiconductor transistor) may be appropriately lengthened (e.g., shown in FIG. 23) to make S6−S5>S8−S7, which may make the third transistor 60 used as the drive transistor have a relatively stable threshold voltage and improve the stability of the gate electrode potential, thereby being beneficial for better realizing the storage of the data voltage signal by the gate electrode of the drive transistor. However, when the fourth transistor 70 of the oxide semiconductor transistor is used as the switch transistor of the pixel circuit 40, the fourth transistor 70 may only function as a switch. Therefore, the seventh area S7 defined by the seventh gate electrode 70G of the fourth transistor 70 and the eighth area S8 defined by the eighth gate electrode 70G2 (the auxiliary gate electrode) may not need to be excessively large, which may save the space of the display panel, thereby being beneficial for improving the PPI of the display panel 000.

Optionally, referring to FIG. 8, FIG. 8 illustrates a structural schematic of the pixel circuit 40 according to various embodiments of the present disclosure. The pixel circuit 40 may include a plurality of switch transistors and drive transistors, a storage capacitor, and a light-emitting diode OLED (7T1C). Taking the structure of the pixel circuit 40 as an example, the third transistor 60 (e.g., an oxide semiconductor transistor) may be the drive transistor M3 in the pixel circuit 40; and the fourth transistor 70 (e.g., an oxide semiconductor transistor) may be any one or more of the switch transistors M1, M2, M4, M5, M6, and M7 in the pixel circuit 40.

In some optional embodiments, referring to FIGS. 22 and 23, in the pixel circuit 40, the difference between the sixth area S6 defined by the sixth gate electrode 60G2 of the third transistor 60 (e.g., an oxide semiconductor transistor) of the double gate structure and the fifth area S5 defined by the fifth gate electrode 60G of the third transistor 60 is S6−S5; in the drive circuit 50, the difference between the fourth area S4 defined by the fourth gate electrode 30G2 of the second transistor 30 (e.g., an oxide semiconductor transistor) of the double gate structure and the second area S2 defined by the second gate electrode 30G of the second transistor 30 is S4−S2; and in the pixel circuit 40, the difference between the eighth area S8 defined by the eighth gate electrode 70G2 (the auxiliary gate electrode) of the fourth transistor 70 (e.g., an oxide semiconductor transistor) of the double gate structure and the seventh area S7 defined by the seventh gate electrode 70G of the fourth transistor 70 is S8−S7, and (S6−S5)−(S8−S7)>(S8−S7)−(S4−S2), that is, (S6−S5)+(S4−S2)>2(S8−S7).

In one embodiment, it may describe that when the third transistor 60 in the pixel circuit 40 is used as the drive transistor, compared with the fourth transistor 70 used as the switch transistor in the pixel circuit 40, the difference between the sixth area S6 defined by the sixth gate electrode 60G2 of the third transistor 60 (e.g., an oxide semiconductor transistor) of the double gate structure and the fifth area S5 defined by the fifth gate electrode 60G of the third transistor 60 may be greater than the difference between the eighth area S8 defined by the eighth gate electrode 70G2 of the fourth transistor 70 (e.g., an oxide semiconductor transistor) of the double gate structure and the seventh area S7 defined by the seventh gate electrode 70G of the fourth transistor 70. Since various structures in the pixel circuits in the display region of the display panel 000 are relatively complicated, in one embodiment, when the fourth transistor 70 is used as the switch transistor, the eighth area S8 defined by the eighth gate electrode 70G2 of the fourth transistor 70 in the pixel circuit 40 and the seventh area S7 defined by the seventh gate electrode 70G of the fourth transistor 70 may both be configured to be relatively small, that is, the difference between S8 and S7 may also be relatively small, which may reduce the load caused by the parasitic capacitance of the pixel circuit 40, thereby being beneficial for improving the response speed of the pixel circuit 40 and reducing the problem of hysteresis. The eighth area S8 defined by the eighth gate electrode 70G2 of the fourth transistor 70 and the seventh area S7 defined by the seventh gate electrode 70G of the fourth transistor 70 are both relatively small. Therefore, the difference between the eighth area S8 defined by the eighth gate electrode 70G2 of the fourth transistor 70 (e.g., an oxide semiconductor transistor) of the double gate structure and the seventh area S7 defined by the seventh gate electrode 70G of the fourth transistor 70 may be greater than the difference between the fourth area S4 defined by the fourth gate electrode 30G2 of the second transistor 30 (e.g., an oxide semiconductor transistor) of the double gate structure and the second area S2 defined by the second gate electrode 30G of the second transistor 30; and the difference between (S8−S7) and (S4−S2) may not be configured to be excessively large, that is, the difference between (S6−S5)

and (S8−S7) may be greater than the difference between (S8−S7) and (S4−S2), which may be beneficial for improving the PPI of the display panel while also improving the reliability of the pixel circuit 40.

Figure 24:
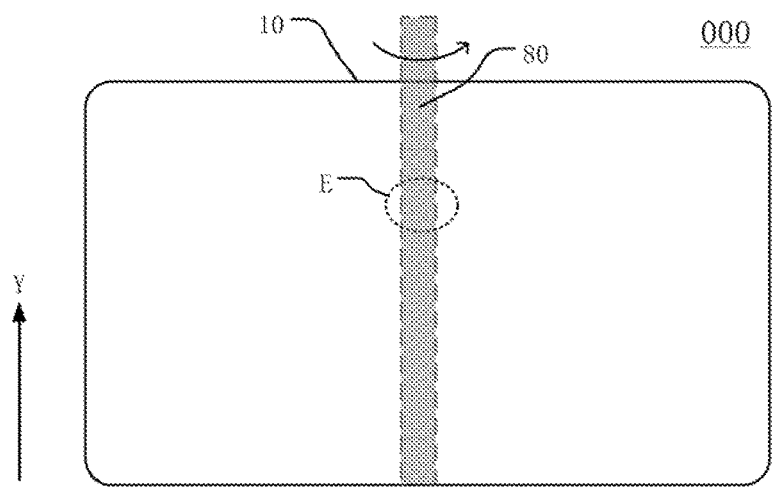
FIG. 24 illustrates another planar structural schematic of a display panel according to various embodiments of the present disclosure.
Figure 25:
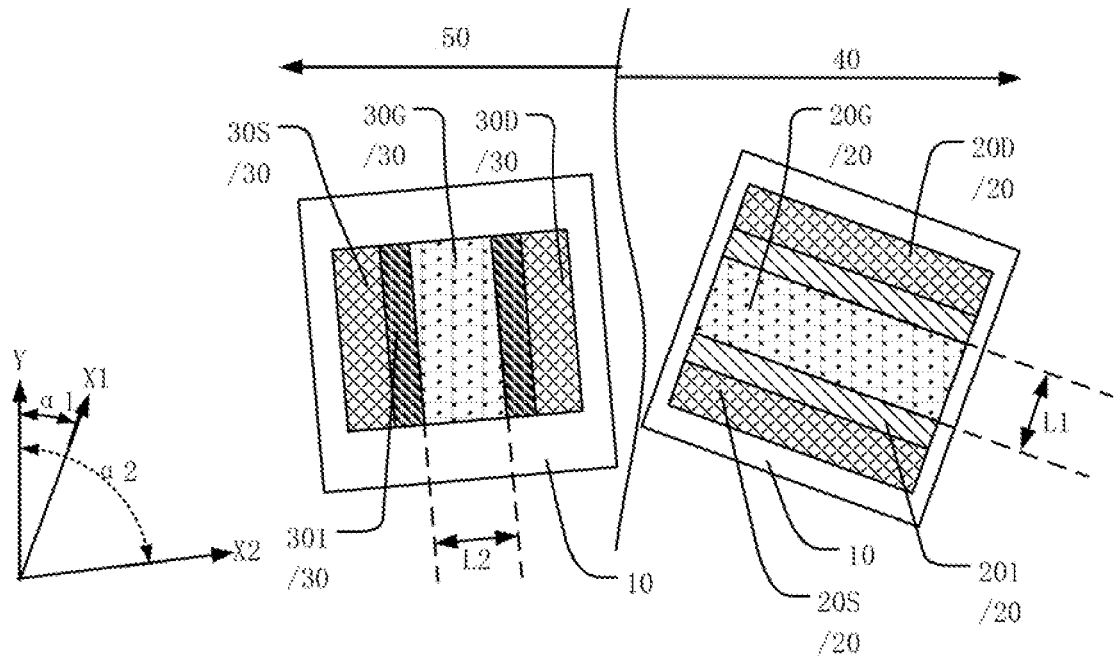
FIG. 25 illustrates a local enlarged schematic at a region E in FIG. 24.

In some optional embodiments, referring to FIGS. 24 and 25, FIG. 24 illustrates another planar structural schematic of the display panel according to various embodiments of the present disclosure; and FIG. 25 illustrates a local enlarged schematic at a region E in FIG. 24. It should be understood that FIG. 25 may exemplarily illustrate a local top view of a first transistor and a second transistor. The first transistor and the second transistor may be illustrated together for description to clearly illustrate the technical features of the first transistor and the second transistor, which may not indicate the actual disposing positions of the first transistor and the second transistor in the display panel. During an implementation, the disposing positions and the connection relationship of the first transistor and the second transistor may be determined by the layout of the drive circuit and the pixel circuit. In one embodiment, the display panel 000 may be a foldable display panel, and the display panel 000 may include a bending axis 80 extending along a first direction Y. The angle α2 between the length L2 direction of the channel region of the second transistor 30 and the first direction Y may be greater than 45 degrees, and the angle α1 between the length L1 direction of the channel region of the first transistor 20 and the first direction Y may be less than 45 degrees.

In one embodiment, it may describe that the first transistor 20 and the second transistor 30 of the display panel 000 may be formed on the base substrate 10; the first transistor 20 may include the first active layer 201, the first gate electrode 20G, the first source electrode 20S, and the first drain electrode 20D; and the first active layer 201 may include silicon, that is, the first transistor 20 may be a silicon transistor. The silicon may be polysilicon, that is, LTPS (low temperature polysilicon), deposited by a low-temperature method. The length of the channel region of the first transistor 20 is L1. The channel region of the first transistor 20 is the region where the first active layer 201 of the first transistor 20 overlaps the first gate electrode 20G. The length L1 of the channel region of the first transistor 20 is the length of the channel region of the first transistor 20 along the current transmission direction between the first source electrode 20S and the first drain electrode 20D (a direction X1 in FIG. 25). The second transistor 30 may include the second active layer 301, the second gate electrode 30G, the second source electrode 30S, and the second drain electrode 30D. The second active layer 301 may include an oxide semiconductor, that is, the second transistor 30 may be an oxide semiconductor transistor, and the oxide semiconductor material may be an amorphous indium gallium zinc oxide (IGZO). The length of the channel region of the second transistor 30 is L2. The channel region of the second transistor 30 is the region where the second active layer 301 of the second transistor 30 overlaps the second gate electrode 30G. The length of the channel region of the second transistor 30 is the length of the channel region of the second transistor 30 along the current transmission direction between the second source 30S and the second drain 30D (a direction X2 in FIG. 25). The display panel 000 in one embodiment may be a foldable display panel, and the foldable display panel may include the bending axis 80 extending along the first direction Y. The angle α2 between the length direction X2 of the channel region of the second transistor 30 and the first direction Y may be greater than 45 degrees; and the angle α1 between the length direction X1 of the channel region of the first transistor 20 and the first direction Y may be less than 45 degrees. The second transistor 30 (e.g., an oxide semiconductor transistor) may have desirable bending performance. Therefore, in one embodiment, the angle α2 between the length direction X2 of the channel region of the second transistor 30 and the first direction Y may be configured to be greater than 45 degrees, that is, the angle α2 may be more inclined to 90 degrees; and the angle α1 between the length direction X1 of the channel region of the first transistor 20 and the first direction Y may be configured to be less than 45 degrees, that is, the angle α1 may be more inclined to 0 degree. In such way, the second transistor 30 with better bending performance may pass through the region where the bending axis 80 is located as much as possible to bear a greater bending pressure; and the first transistor 20 with poor bending performance may avoid passing through the region where the bending axis 80 is located as much as possible, which may avoid the failure of the first transistor 20 due to bending, thereby being beneficial for improving the product yield.

Figure 26:
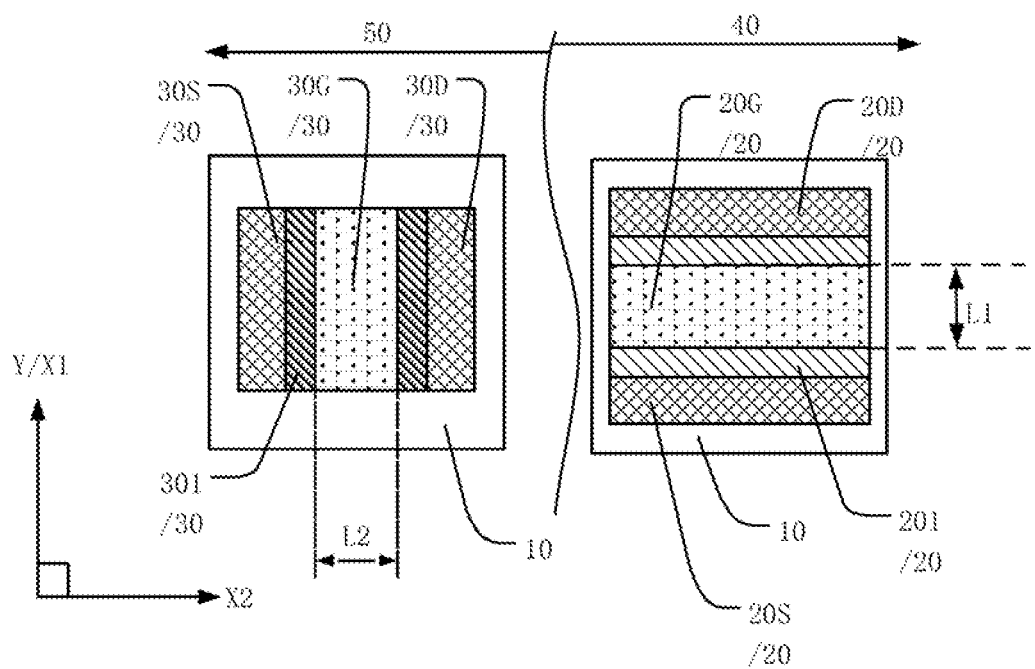
FIG. 26 illustrates another local enlarged schematic at a region E in FIG. 24.

In some optional embodiments, referring to FIGS. 24 and 26, FIG. 26 illustrates another local enlarged schematic at the region E in FIG. 24. It should be understood that FIG. 26 may exemplarily illustrate a local top view of a first transistor and a second transistor. The first transistor and the second transistor may be illustrated together for description to clearly illustrate the technical features of the first transistor and the second transistor, which may not indicate the actual disposing positions of the first transistor and the second transistor in the display panel. During an implementation, the disposing positions and the connection relationship of the first transistor and the second transistor may be determined by the layout of the drive circuit and the pixel circuit. In one embodiment, the length direction X2 of the channel region of the second transistor 30 may be perpendicular to the first direction Y; and the length direction X1 of the channel region of the first transistor 20 may be in parallel with the first direction Y.

In one embodiment, it may describe that the first transistor 20 and the second transistor 30 of the display panel 000 may be formed on the base substrate 10; the first transistor 20 may include the first active layer 201, the first gate electrode 20G, the first source electrode 20S, and the first drain electrode 20D; and the first active layer 201 may include silicon, that is, the first transistor 20 may be a silicon transistor. The silicon may be polysilicon, that is, LTPS (low temperature polysilicon), deposited by a low-temperature method. The length of the channel region of the first transistor 20 is L1. The channel region of the first transistor 20 is the region where the first active layer 201 of the first transistor 20 overlaps the first gate electrode 20G. The length L1 of the channel region of the first transistor 20 is the length of the channel region of the first transistor 20 along the current transmission direction between the first source electrode 20S and the first drain electrode 20D (a direction X1 in FIG. 26). The second transistor 30 may include the second active layer 301, the second gate electrode 30G, the second source electrode 30S, and the second drain electrode 30D. The second active layer 301 may include an oxide semiconductor, that is, the second transistor 30 may be an oxide semiconductor transistor, and the oxide semiconductor material may be an amorphous indium gallium zinc oxide (IGZO). The length of the channel region of the second transistor 30 is L2. The channel region of the second transistor 30 is the region where the second active layer 301 of the second transistor 30 overlaps the second gate electrode 30G. The length of the channel region of the second transistor 30 may be the length of the channel region of the second transistor 30 along the current transmission direction between the second source 30S and the second drain 30D (a direction X2 in FIG. 26). The display panel 000 in one embodiment may be a foldable display panel, and the foldable display panel may include the bending axis 80 extending along the first direction Y. The length direction X2 of the channel region of the second transistor 30 may be perpendicular to the first direction, and the length direction X1 of the channel region of the first transistor 20 may be in parallel with the first direction Y. The second transistor 30 (e.g., an oxide semiconductor transistor) may have desirable bending performance. Therefore, in one embodiment, the angle between the length direction X2 of the channel region of the second transistor 30 and the first direction Y may be configured to be 90 degrees, and the angle between the length direction X1 of the channel region of the first transistor 20 and the first direction Y may be configured to be 0 degree. Furthermore, the second transistor 30 with better bending performance may pass through the region where the bending axis 80 is located as much as possible to bear a greater bending pressure; and the first transistor 20 with poor bending performance may avoid passing through the region where the bending axis 80 is located as much as possible, which may avoid the failure of the first transistor 20 due to bending, thereby being beneficial for improving the product yield.

Figure 27:
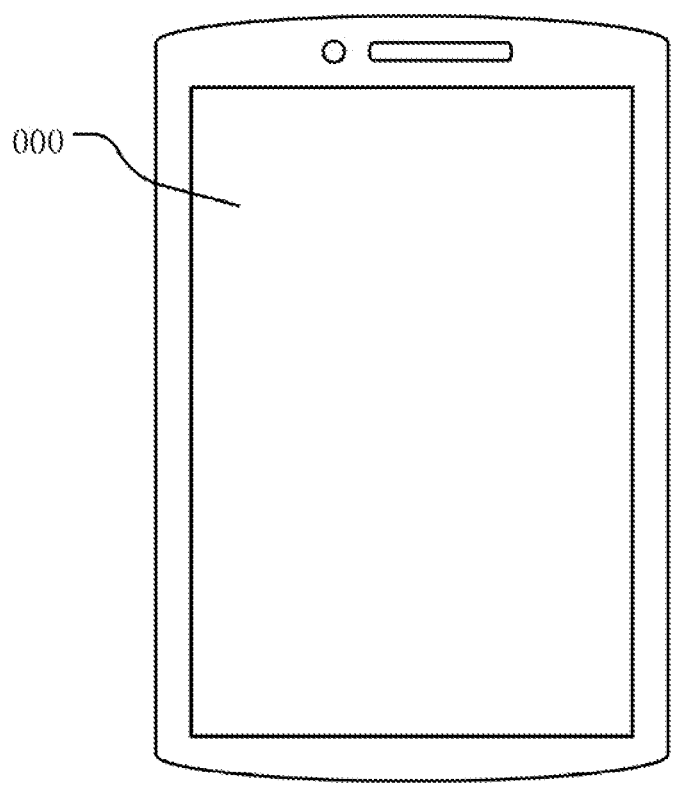
FIG. 27 illustrates a planar structural schematic of a display device according to various embodiments of the present disclosure.

In some alternative embodiments, referring to FIG. 27, FIG. 27 illustrates a planar structural schematic of a display device according to various embodiments of the present disclosure. A display device 111, provided in one embodiment, may include the display panel 000 provided in the above-mentioned embodiments of the present disclosure. A mobile phone may be taken as an example to illustrate the display device 111 in FIG. 27. It should be understood that the display device 111 provided in the embodiments of the present disclosure may be a computer, a television, a vehicle-mounted display device, or other display device having a display function, which may not be limited according to various embodiments of the present disclosure. The display device 111 provided by the embodiments of the present disclosure may have the beneficial effects of the display panel 000 provided by the embodiments of the present disclosure, which may refer to the description of the display panel 000 in the above-mentioned embodiments and may not be described in detail herein.

From the above-mentioned embodiments, it can be seen that the display panel and the display device provided by the present disclosure may achieve at least the following beneficial effects.

In the display panel provided in the present disclosure, along the direction perpendicular to the base substrate, the distance between the first gate electrode and the first active layer is $D1$, and the first area $S1=L1 \times D1$; and the distance between the second gate electrode and the second active layer is $D2$, the second area $S2=L2 \times D2$, and $S1<S2$. The first transistor (the silicon transistor) has desirable responsiveness. Therefore, in order to fully increase the PPI of the display panel, the lengths of the channel regions of such two types of transistors may also be designed to be as small as possible by utilizing the advantages of silicon transistors and oxide semiconductor transistors in the present disclosure, which is beneficial for saving circuit space and further increasing the PPI of the display panel. In the present disclosure, along the direction perpendicular to the base substrate of the display panel, the first area $S1$ may be less than the second area $S2$, where the first area $S1=L1 \times D1$, and the second area $S2=L2 \times D2$; and the distance between the first gate electrode of the first transistor (the silicon transistor) and the first active layer is $D1$, and the distance between the second gate electrode of the second transistor (the oxide semiconductor transistor) and the second active layer is $D2$. Therefore, the features and advantages of silicon transistors and oxide semiconductor transistors may be fully utilized, and while ensuring the stability and normal operation of the transistors, the space of the display panel may be saved, and the PPI of the display panel may be improved, thereby being further beneficial for improving the display quality of the display panel 000 and improving the display effect and the product competitiveness.

Although certain embodiments of the present disclosure have been described in detail through examples, those skilled in the art should understand that the above-mentioned examples are merely for illustration and not for limiting the scope of the present disclosure. Those skilled in the art should understand that the above-mentioned embodiments may be modified without departing from the scope and spirit of the present disclosure, and the scope of the present disclosure is defined by the appended claims.

What is claimed is:

1. A display panel, comprising:
   a base substrate;
   a third transistor and a fourth transistor;
   wherein:
   the third transistor and the fourth transistor are formed on the base substrate;
   the third transistor includes a sixth gate electrode, a third active layer, a third source electrode, and a third drain electrode;
   the third active layer includes an oxide semiconductor;
   the fourth transistor includes an eighth gate electrode, a fourth active layer, a fourth source electrode, and a fourth drain electrode; and
   the fourth active layer includes another oxide semiconductor;
   along a direction perpendicular to the base substrate, a distance between the sixth gate electrode and the third active layer is $D6$, a channel region of the third transistor defined by the sixth gate electrode is a sixth channel region, a length of the sixth channel region is $L6$, and a sixth area $S6=L6 \times D6$; and
   along the direction perpendicular to the base substrate, a distance between the eighth gate electrode and the fourth active layer is $D8$, a channel region of the fourth transistor defined by the eighth gate electrode is an eighth channel region, a length of the eighth channel region is $L8$, and an eighth area $S8=L8 \times D8$; and
   a pixel circuit and a drive circuit providing a drive signal for the pixel circuit, wherein the third transistor is a drive transistor of the pixel circuit, the fourth transistor is a switch transistor of the pixel circuit, and $S6>S8$, wherein:
   the third transistor further includes a fifth gate electrode, and along the direction perpendicular to the base substrate, a distance between the fifth gate electrode and the third active layer is $D5$, a channel region of the third transistor defined by the fifth gate electrode is a fifth channel region, a length of the fifth channel region is $L5$, and a fifth area $S5=L5 \times D5$,
   the fourth transistor further includes a seventh gate electrode, and along the direction perpendicular to the base substrate, a distance between the seventh gate electrode and the fourth active layer is $D7$, a channel region of the fourth transistor defined by the seventh gate electrode is a seventh channel region, a length of the seventh channel region is L7, and a seventh area S7=L7×D7, and
(S6−S5)> (S8−S7),
wherein S8≠S7.

2. The display panel according to claim 1, wherein: D5<D6 and/or S5<S6.

3. The display panel according to claim 2, wherein: D7<D8 and/or S7<S8.

4. The display panel according to claim 3, wherein:
the drive circuit includes a second transistor; and the second transistor includes a second active layer, a second gate electrode, a second source electrode, and a second drain electrode; and the second active layer includes another oxide semiconductor; and
a length of a channel region of the second transistor is L2; along the direction perpendicular to the base substrate, a distance between the second gate electrode and the second active layer is D2; and a second area S2=L2× D2, wherein S2<S5.

5. The display panel according to claim 4, wherein:
the second transistor further includes a fourth gate electrode; and along the direction perpendicular to the base substrate, a distance between the fourth gate electrode and the second active layer is D4;
a channel region of the second transistor defined by the second gate electrode is a second channel region, and a length of the second channel region is L2;
a channel region of the second transistor defined by the fourth gate electrode is a fourth channel region, and a length of the fourth channel region is L4, and a fourth area S4=L4×D4; and
D2<D4, and/or S2<S4.

6. The display panel according to claim 5, wherein: S6>S4.

7. The display panel according to claim 5, wherein: (S4−S2)<(S6−S5).

8. The display panel according to claim 5, wherein: (S6−S5)+(S4−S2)>2 (S8−S7).

9. The display panel according to claim 1, further comprising a first transistor, wherein:
the first transistor is included in one of the pixel circuit and the drive circuit; and
the first transistor includes a first active layer, a first gate electrode, a first source electrode, and a first drain electrode; the first active layer includes silicon; a length of a channel region of the first transistor is L1; along the direction perpendicular to the base substrate, a distance between the first gate electrode and the first active layer is D1; and a first area S1=L1×D1, wherein S1<S5.

10. The display panel according to claim 5, wherein:
the pixel circuit further includes a first capacitor, configured to store a data voltage transmitted to a gate electrode of the third transistor, wherein the sixth gate electrode is multiplexed as a plate of the first capacitor.

11. The display panel according to claim 10, wherein:
the drive circuit further includes a second capacitor;
the fourth gate electrode is multiplexed as a plate of the second capacitor; and
a capacitance value of the first capacitor is greater than a capacitance value of the second capacitor.

12. The display panel according to claim 1, wherein:
the display panel is a foldable display panel which includes a bending axis extending along a first direction; and
an angle between a length direction of a channel region of a second transistor and the first direction is greater than 45 degrees, and an angle between a length direction of a channel region of a first transistor and the first direction is less than 45 degrees.

13. The display panel according to claim 12, wherein:
the length direction of the channel region of the second transistor is perpendicular to the first direction; and
the length direction of the channel region of the first transistor is in parallel with the first direction.

14. A display panel, comprising:
a base substrate;
a third transistor and a fourth transistor;
wherein:
the third transistor and the fourth transistor are formed on the base substrate; the third transistor includes a sixth gate electrode, a third active layer, a third source electrode, and a third drain electrode;
the third active layer includes an oxide semiconductor; the fourth transistor includes an eighth gate electrode, a fourth active layer, a fourth source electrode, and a fourth drain electrode; and
the fourth active layer includes another oxide semiconductor;
along a direction perpendicular to the base substrate, a distance between the sixth gate electrode and the third active layer is D6, a channel region of the third transistor defined by the sixth gate electrode is a sixth channel region, a length of the sixth channel region is L6, and a sixth area S6=L6×D6;
along the direction perpendicular to the base substrate, a distance between the eighth gate electrode and the fourth active layer is D8, a channel region of the fourth transistor defined by the eighth gate electrode is an eighth channel region, a length of the eighth channel region is L8, and an eighth area S8=L8×D8, wherein S6>S8;
the third transistor further includes a fifth gate electrode, and along the direction perpendicular to the base substrate, a distance between the fifth gate electrode and the third active layer is D5, a channel region of the third transistor defined by the fifth gate electrode is a fifth channel region, a length of the fifth channel region is L5, and a fifth area S5=L5×D5;
the fourth transistor further includes a seventh gate electrode, and along the direction perpendicular to the base substrate, a distance between the seventh gate electrode and the fourth active layer is D7, a channel region of the fourth transistor defined by the seventh gate electrode is a seventh channel region, a length of the seventh channel region is L7, and a seventh area S7=L7×D7; and
(S6−S5)> (S8−S7),
wherein S8≠S7.

15. The display panel according to claim 14, wherein: D5<D6 and/or S5<S6.

16. The display panel according to claim 15, wherein: D7<D8 and/or S7<S8.

17. A display device, comprising a display panel, the display panel comprising a base substrate;
a third transistor and a fourth transistor;
wherein:
the third transistor and the fourth transistor are formed on the base substrate;
the third transistor includes a sixth gate electrode, a third active layer, a third source electrode, and a third drain electrode;
the third active layer includes an oxide semiconductor;

the fourth transistor includes an eighth gate electrode, a fourth active layer, a fourth source electrode, and a fourth drain electrode; and the fourth active layer includes another oxide semiconductor;

along a direction perpendicular to the base substrate, a distance between the sixth gate electrode and the third active layer is D6, a channel region of the third transistor defined by the sixth gate electrode is a sixth channel region, a length of the sixth channel region is L6, and a sixth area S6=L6×D6; and along the direction perpendicular to the base substrate, a distance between the eighth gate electrode and the fourth active layer is D8, a channel region of the fourth transistor defined by the eighth gate electrode is an eighth channel region, a length of the eighth channel region is L8, and an eighth area S8=L8×D8; and a pixel circuit and a drive circuit providing a drive signal for the pixel circuit, wherein the third transistor is a drive transistor of the pixel circuit, the fourth transistor is a switch transistor of the pixel circuit, and S6>S8, wherein:

the third transistor further includes a fifth gate electrode, and along the direction perpendicular to the base substrate, a distance between the fifth gate electrode and the third active layer is D5, a channel region of the third transistor defined by the fifth gate electrode is a fifth channel region, a length of the fifth channel region is L5, and a fifth area S5=L5×D5, the fourth transistor further includes a seventh gate electrode, and along the direction perpendicular to the base substrate, a distance between the seventh gate electrode and the fourth active layer is D7, a channel region of the fourth transistor defined by the seventh gate electrode is a seventh channel region, a length of the seventh channel region is L7, and a seventh area S7=L7×D7, and (S6−S5)> (S8−S7), wherein S8≠S7.

18. A display device, comprising the display panel according to claim 14.

* * * * *